(12) United States Patent
Nakajima

(10) Patent No.: US 10,160,201 B2
(45) Date of Patent: Dec. 25, 2018

(54) LIQUID DISCHARGING APPARATUS AND CIRCUIT SUBSTRATE

(71) Applicant: SEIKO EPSON CORPORATION, Tokyo (JP)

(72) Inventor: Akira Nakajima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/835,873

(22) Filed: Dec. 8, 2017

(65) Prior Publication Data

US 2018/0178510 A1  Jun. 28, 2018

(30) Foreign Application Priority Data

Dec. 22, 2016  (JP) ................. 2016-248692

(51) Int. Cl.
| | |
|---|---|
| B41J 2/045 | (2006.01) |
| B41J 2/14 | (2006.01) |
| H01L 41/047 | (2006.01) |
| B41J 2/175 | (2006.01) |
| B41J 29/377 | (2006.01) |
| B41J 29/393 | (2006.01) |

(52) U.S. Cl.
CPC ......... *B41J 2/04541* (2013.01); *B41J 2/0458* (2013.01); *B41J 2/04581* (2013.01); *B41J 2/04588* (2013.01); *B41J 2/04593* (2013.01); *B41J 2/04596* (2013.01); *B41J 2/14088* (2013.01); *B41J 2/14233* (2013.01); *B41J 2/17556* (2013.01); *B41J 29/377* (2013.01); *B41J 29/393* (2013.01); *H01L 41/0477* (2013.01); *B41J 2002/14491* (2013.01)

(58) Field of Classification Search
CPC .. B41J 2/04541; B41J 2/0458; B41J 2/04581; B41J 2/04588; B41J 2/04593; B41J 2/04596; B41J 2/14088; B41J 41/0477; B41J 2/14233; B41J 2002/14491
See application file for complete search history.

(56) References Cited

U.S. PATENT DOCUMENTS

| | | | | |
|---|---|---|---|---|
| 8,256,856 | B2 * | 9/2012 | Yamashita | B41J 2/04551 347/10 |
| 8,950,841 | B2 * | 2/2015 | Otsuka | B41J 2/04541 347/14 |
| 9,944,076 | B2 * | 4/2018 | Kashimura | B41J 2/04541 |

FOREIGN PATENT DOCUMENTS

| | | |
|---|---|---|
| JP | 2011-046160 A | 3/2011 |
| JP | 2014-188914 A | 10/2014 |

\* cited by examiner

*Primary Examiner* — Lamson Nguyen

(57) ABSTRACT

There is provided a liquid discharging apparatus including a head unit that has a first driving element and discharges a first liquid based on a first drive signal for driving the first driving element and a first control signal for controlling application of the first drive signal to the first driving element and a circuit substrate. First drive signal transmitting wiring through which the first drive signal is transmitted. The shortest distance between a first side of the circuit substrate and the first drive signal transmitting wiring is shorter than the shortest distance between the first drive signal transmitting wiring and the first control signal transmitting wiring. The shortest distance between a second side opposing the first side of the circuit substrate and the first control signal transmitting wiring is shorter than the shortest distance between the first drive signal transmitting wiring and the first control signal transmitting wiring.

9 Claims, 19 Drawing Sheets

FIG. 7
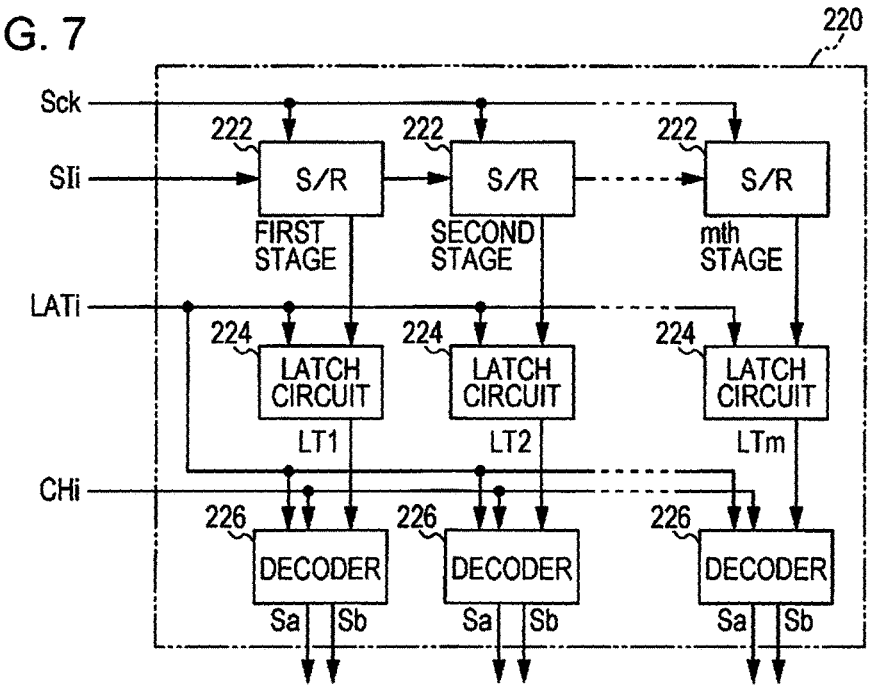
FIG. 8
| (SIH, SIL) | T1 | | T2 | |
|---|---|---|---|---|
| | Sa | Sb | Sa | Sb |
| (1, 1) [LARGE DOT] | H | L | H | L |
| (1, 0) [MEDIUM DOT] | H | L | L | H |
| (0, 1) [SMALL DOT] | L | L | L | H |
| (0, 0) [NON-RECORDING] | L | H | L | L |
FIG. 9
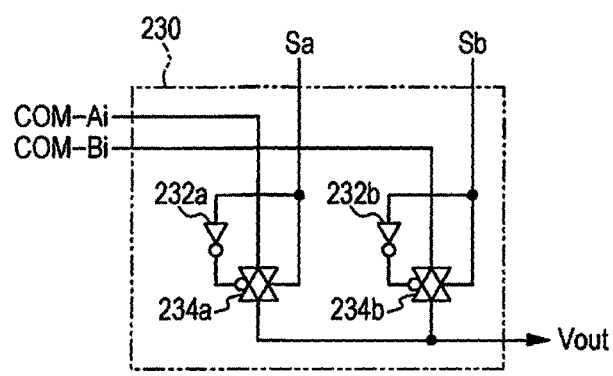

LIQUID DISCHARGING APPARATUS AND CIRCUIT SUBSTRATE

BACKGROUND

1. Technical Field

The present invention relates to a liquid discharging apparatus and a circuit substrate.

2. Related Art

An apparatus using a piezoelectric element is known as a liquid discharging apparatus such as an ink jet printer that discharges inks and prints an image or characters. The piezoelectric element is provided so as to correspond to each of a plurality of discharging units in a head (ink jet head), and each of the discharging units is driven in accordance with a drive signal. As a consequence, a predetermined amount of an ink (liquid) is discharged at predetermined timing from nozzles of the discharging units, forming dots. In JP-A-2014-188914, a relay substrate in which wiring to transmit a signal for driving a head to a discharge head is disclosed.

The signal for driving a head includes a drive signal to drive the piezoelectric element provided so as to correspond to each nozzle and a control signal to control application of the drive signal to the piezoelectric element. In a circuit substrate where wiring which transmits the signals are formed, there is a possibility that signal degradation occurs when transmitting the signals due to interference of the drive signal and the control signal with each other depending on the layout of the wiring.

SUMMARY

An advantage of some aspects of the invention is to provide a liquid discharging apparatus that can reduce a possibility that signal degradation occurs due to interference of a drive signal and a control signal with each other in a circuit substrate and that can accurately discharge a liquid. Another advantage of some aspects of the invention is to provide a circuit substrate that can reduce a possibility that signal degradation occurs due to interference of a drive signal and a control signal with each other.

The invention can be realized in the following aspects or application examples.

Application Example 1

According to this application example, there is provided a liquid discharging apparatus including a head unit that has a first driving element and discharges a first liquid based on a first drive signal for driving the first driving element and a first control signal for controlling application of the first drive signal to the first driving element and a circuit substrate. First drive signal transmitting wiring through which the first drive signal is transmitted and first control signal transmitting wiring through which the first control signal is transmitted are provided on the circuit substrate. The shortest distance between a first side of the circuit substrate and the first drive signal transmitting wiring is shorter than the shortest distance between the first drive signal transmitting wiring and the first control signal transmitting wiring. The shortest distance between a second side opposing the first side of the circuit substrate and the first control signal transmitting wiring is shorter than the shortest distance between the first drive signal transmitting wiring and the first control signal transmitting wiring.

The first driving element may be, for example, a piezoelectric element, or may be a heating element. In addition, the first control signal may be, for example, a differential signal used in high-speed signal transmission.

In the liquid discharging apparatus according to the application example, the first drive signal transmitting wiring and the first control signal transmitting wiring are separated away from each other in the circuit substrate since the first drive signal transmitting wiring is provided next to the first side and the first control signal transmitting wiring is provided next to the second side opposing the first side. Therefore, in the liquid discharging apparatus according to the application example, the first liquid can be accurately discharged since a possibility that at least one of the first drive signal and the first control signal degrades due to interference of the first drive signal propagated by the first drive signal transmitting wiring and the first control signal propagated by the first control signal transmitting wiring with each other can be reduced in the circuit substrate.

Application Example 2

In the liquid discharging apparatus of the application example, a first drive circuit that outputs the first drive signal may be provided on the circuit substrate.

In the liquid discharging apparatus according to the application example, the entire length of wiring through which the first drive signal is transmitted via the circuit substrate to the head unit is shorter since the first drive circuit that outputs the first drive signal is also provided on the circuit substrate where the first drive signal transmitting wiring is provided. Therefore, in the liquid discharging apparatus according to the application example, the first liquid can be accurately discharged since a possibility that the first drive signal degrades can be reduced in the circuit substrate.

Application Example 3

In the liquid discharging apparatus of the application example, the first drive circuit may be provided between the first drive signal transmitting wiring and the first control signal transmitting wiring in planar view of the circuit substrate.

In the liquid discharging apparatus according to the application example, the first drive circuit is provided in a free region between the first drive signal transmitting wiring and the first control signal transmitting wiring on the circuit substrate since the first drive signal transmitting wiring and the first control signal transmitting wiring are disposed so as to be separated away from each other. Therefore, in the liquid discharging apparatus according to the application example, the circuit substrate can be miniaturized since the free region on the circuit substrate can be reduced.

Application Example 4

In the liquid discharging apparatus of the application example, the first drive circuit may include a modulation circuit that modulates an original drive signal, which is an underlying signal of the first drive signal, to generate a modulation signal, an amplification circuit that generates an amplified modulation signal obtained by amplifying the modulation signal, and a demodulation circuit that demodulates the amplified modulation signal to generate the first drive signal. The shortest distance between the first control signal transmitting wiring and the modulation circuit may be shorter than the shortest distance between the first control signal transmitting wiring and the amplification circuit.

In the liquid discharging apparatus according to the application example, in the circuit substrate, the first control signal transmitting wiring is provided at a position separated away from the amplification circuit that generates the first drive signal on the first drive circuit. Therefore, in the liquid discharging apparatus according to the application example, the first liquid can be accurately discharged since a possibility that the first control signal degrades due to the first drive signal can be reduced in the circuit substrate.

Application Example 5

In the liquid discharging apparatus of the application example, the first control signal transmitting wiring may be provided on a first layer of the circuit substrate, and wiring with a constant electric potential may be provided on each of two layers sandwiching the first layer of the circuit substrate, in regions opposing a region where the first control signal transmitting wiring is provided.

In the liquid discharging apparatus according to the application example, in the circuit substrate, the first control signal is guarded by being sandwiched between the wiring pieces with a constant electric potential. Therefore, in the liquid discharging apparatus according to the application example, the first liquid can be accurately discharged since a possibility that the first control signal degrades can be reduced in the circuit substrate.

Application Example 6

In the liquid discharging apparatus of the application example, the head unit may discharge the first liquid by the first driving element being driven by the first drive signal applied to one end of the first driving element and a reference voltage signal applied to the other end of the first driving element. Reference voltage signal transmitting wiring through which the reference voltage signal is transmitted may be further provided on the circuit substrate. The first drive signal transmitting wiring may be provided on a second layer of the circuit substrate. The reference voltage signal transmitting wiring may be provided on a third layer of the circuit substrate, in a region opposing a region where the first drive signal transmitting wiring is provided.

In the liquid discharging apparatus according to the application example, there is a current path, through which a current flows in the first drive signal transmitting wiring, the first driving element, and the reference voltage signal transmitting wiring in this order. In the circuit substrate, the current path is shorter since the first drive signal transmitting wiring and the reference voltage signal transmitting wiring are provided so as to oppose each other on two different layers of the circuit substrate. Therefore, in the liquid discharging apparatus according to the application example, the first liquid can be accurately discharged since the wiring impedance of a current path for driving the driving element can be reduced.

Application Example 7

In the liquid discharging apparatus of the application example, the head unit may have a second driving element and discharge a second liquid based on a second drive signal for driving the second driving element and a second control signal for controlling application of the second drive signal to the second driving element. Second drive signal transmitting wiring through which the second drive signal is transmitted may be further provided on the circuit substrate. The second drive signal transmitting wiring may be provided on a fourth layer of the circuit substrate, in a region opposing a region where the reference voltage signal transmitting wiring is provided. The third layer may be a layer positioned between the second layer and the fourth layer.

The second driving element may be, for example, a piezoelectric element, or may be a heating element. In addition, the second control signal may be, for example, a differential signal used in high-speed signal transmission.

In the liquid discharging apparatus according to the application example, relative positional and distance relationships between each of the first drive signal transmitting wiring and second drive signal transmitting wiring and the reference voltage signal transmitting wiring are the same since the first drive signal transmitting wiring and the reference voltage signal transmitting wiring are provided so as to oppose on two different layers of the circuit substrate, the second drive signal transmitting wiring and the reference voltage signal transmitting wiring are provided so as to oppose on two different layers of the circuit substrate, and the reference voltage signal transmitting wiring is sandwiched between the first drive signal transmitting wiring and the second drive signal transmitting wiring. Therefore, in the liquid discharging apparatus according to the application example, a difference between the accuracy of discharging the first liquid and the accuracy of discharging the second liquid can be reduced since a difference between the accuracy of transmitting the first drive signal and the accuracy of transmitting the second drive signal can be reduced in the circuit substrate.

Application Example 8

In the liquid discharging apparatus of the application example, the head unit may have a second driving element and discharge a second liquid based on a second drive signal for driving the second driving element and a second control signal for controlling application of the second drive signal to the second driving element. Second drive signal transmitting wiring through which the second drive signal is transmitted, a second drive circuit that outputs the second drive signal, a first drive signal output terminal that is connected to the first drive signal transmitting wiring and outputs the first drive signal to the head unit, and a second drive signal output terminal that is connected to the second drive signal transmitting wiring and outputs the second drive signal to the head unit may be further provided on the circuit substrate. The shortest distance between the first drive circuit and the first drive signal output terminal may be longer than the shortest distance between the second drive circuit and the second drive signal output terminal in planar view of the circuit substrate. A maximum width of the first drive signal transmitting wiring may be larger than a maximum width of the second drive signal transmitting wiring in planar view of the circuit substrate.

In the liquid discharging apparatus according to the application example, in the circuit substrate, a difference between the wiring impedance of the first drive signal transmitting wiring and the wiring impedance of the second drive signal transmitting wiring is small since the width of the first drive signal transmitting wiring that is longer than the second drive signal transmitting wiring is larger than the width of the second drive signal transmitting wiring. Therefore, in the liquid discharging apparatus according to the application example, a difference between the accuracy of discharging the first liquid and the accuracy of discharging the second liquid can be reduced since a difference between the accuracy of transmitting the first drive signal and the accuracy of transmitting the second drive signal can be reduced in the circuit substrate.

In the liquid discharging apparatus of the application example, the head unit may discharge the second liquid by the second driving element being driven by the second drive signal applied to one end of the second driving element and the reference voltage signal applied to the other end of the second driving element.

In the liquid discharging apparatus of the application example, the shortest distance between the first side of the circuit substrate and the second drive signal transmitting wiring may be shorter than the shortest distance between the second drive signal transmitting wiring and the second control signal transmitting wiring, and the shortest distance between the second side of the circuit substrate and the second control signal transmitting wiring may be shorter than the shortest distance between the second drive signal transmitting wiring and the second control signal transmitting wiring.

In the liquid discharging apparatus of the application example, a second drive circuit that outputs the second drive signal may be provided on the circuit substrate. For example, the second drive circuit may be provided between the second drive signal transmitting wiring and the second control signal transmitting wiring in planar view of the circuit substrate.

In the liquid discharging apparatus of the application example, the second drive circuit may include a modulation circuit that modulates an original drive signal, which is an underlying signal of the second drive signal, to generate a modulation signal, an amplification circuit that generates an amplified modulation signal obtained by amplifying the modulation signal, and a demodulation circuit that demodulates the amplified modulation signal to generate the second drive signal. The shortest distance between the second control signal transmitting wiring and the modulation circuit may be shorter than the shortest distance between the second control signal transmitting wiring and the amplification circuit.

In the liquid discharging apparatus of the application example, the second control signal transmitting wiring may be provided on the first layer of the circuit substrate, and wiring with a constant electric potential may be provided on each of two layers sandwiching the first layer of the circuit substrate, in regions opposing a region where the second control signal transmitting wiring is provided.

Application Example 9

According to this application example, there is provided a circuit substrate that is connected to a head unit having a first driving element and discharging a first liquid based on a first drive signal for driving the first driving element and a first control signal for controlling application of the first drive signal to the first driving element. The circuit substrate includes first drive signal transmitting wiring through which the first drive signal is transmitted and first control signal transmitting wiring through which the first control signal is transmitted. The shortest distance between a first side of the circuit substrate and the first drive signal transmitting wiring is shorter than the shortest distance between the first drive signal transmitting wiring and the first control signal transmitting wiring. The shortest distance between a second side opposing the first side of the circuit substrate and the first control signal transmitting wiring is shorter than the shortest distance between the first drive signal transmitting wiring and the first control signal transmitting wiring.

In the circuit substrate according to the application example, the first drive signal transmitting wiring and the first control signal transmitting wiring are separated away from each other since the first drive signal transmitting wiring is provided next to the first side and the first control signal transmitting wiring is provided next to the second side opposing the first side. Therefore, in the circuit substrate according to the application example, a possibility that at least one of the first drive signal and the first control signal degrades due to interference of the first drive signal propagated by the first drive signal transmitting wiring and the first control signal propagated by the first control signal transmitting wiring with each other can be reduced. Thus, the first liquid can be accurately discharged by the connected head unit.

BRIEF DESCRIPTION OF THE DRAWINGS

The invention will be described with reference to the accompanying drawings, wherein like numbers reference like elements.

FIG. 7 is a diagram showing a configuration of a selection controlling unit.

FIG. 8 is a diagram showing contents of decoding by a decoder.

FIG. 9 is a diagram showing a configuration of a selecting unit.

DESCRIPTION OF EXEMPLARY EMBODIMENTS

Hereinafter, a suitable embodiment of the invention will be described in detail with reference to the drawings. The referred drawings are for the convenience of description. The embodiment to be described below does not wrongfully limit the content of the invention described in the scope of claims. Not all configurations described below are essential configuration requirements.

1. Outline of Liquid Discharging Apparatus

A printing apparatus, which is an example of a liquid discharging apparatus according to the embodiment, is an ink jet printer that forms ink dot groups onto a printing medium, such as paper, by discharging inks according to image data supplied from an external host computer and thereby prints an image (including characters and figures) corresponding to the image data.

Figure 1:
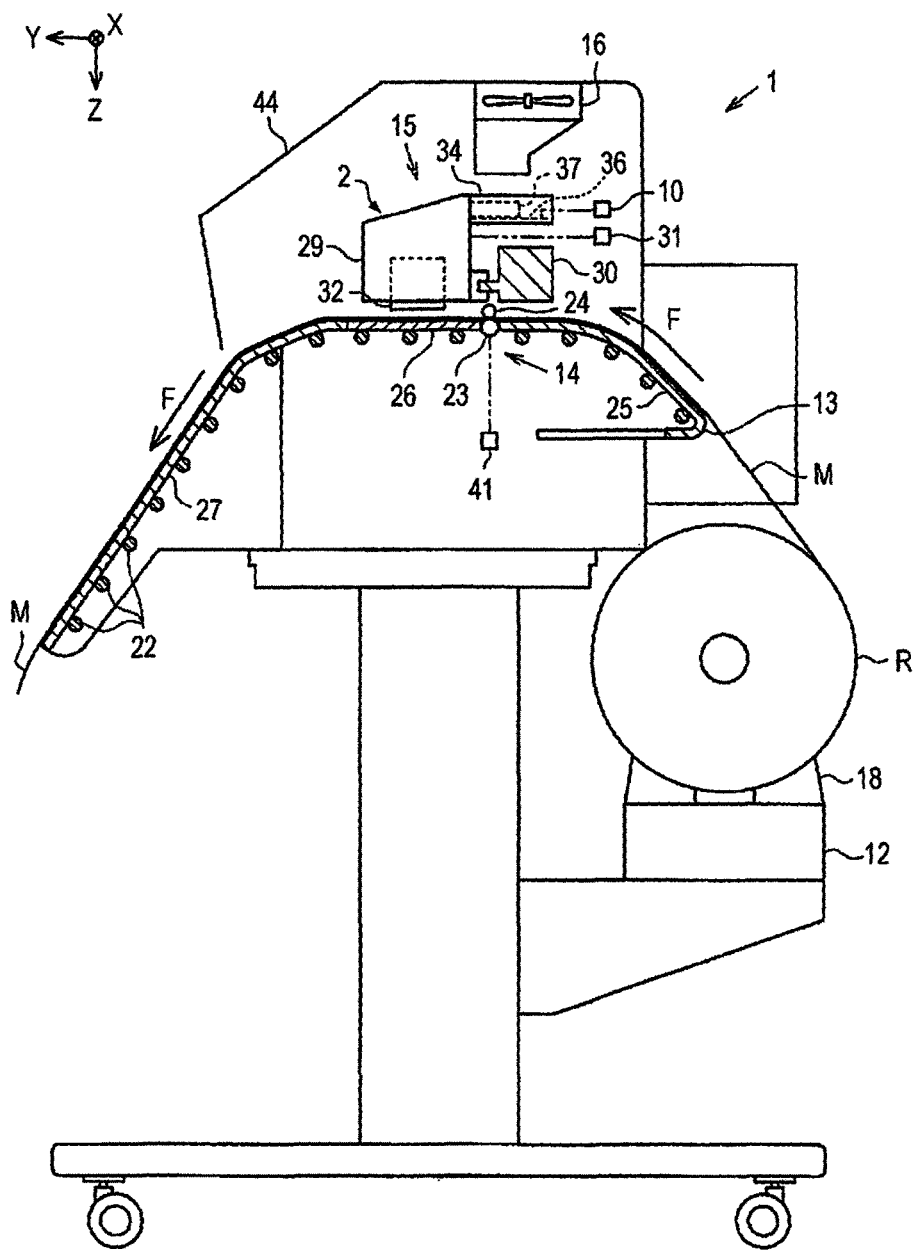
FIG. 1 is a schematic side view illustrating a configuration of a liquid discharging apparatus.
Figure 2:
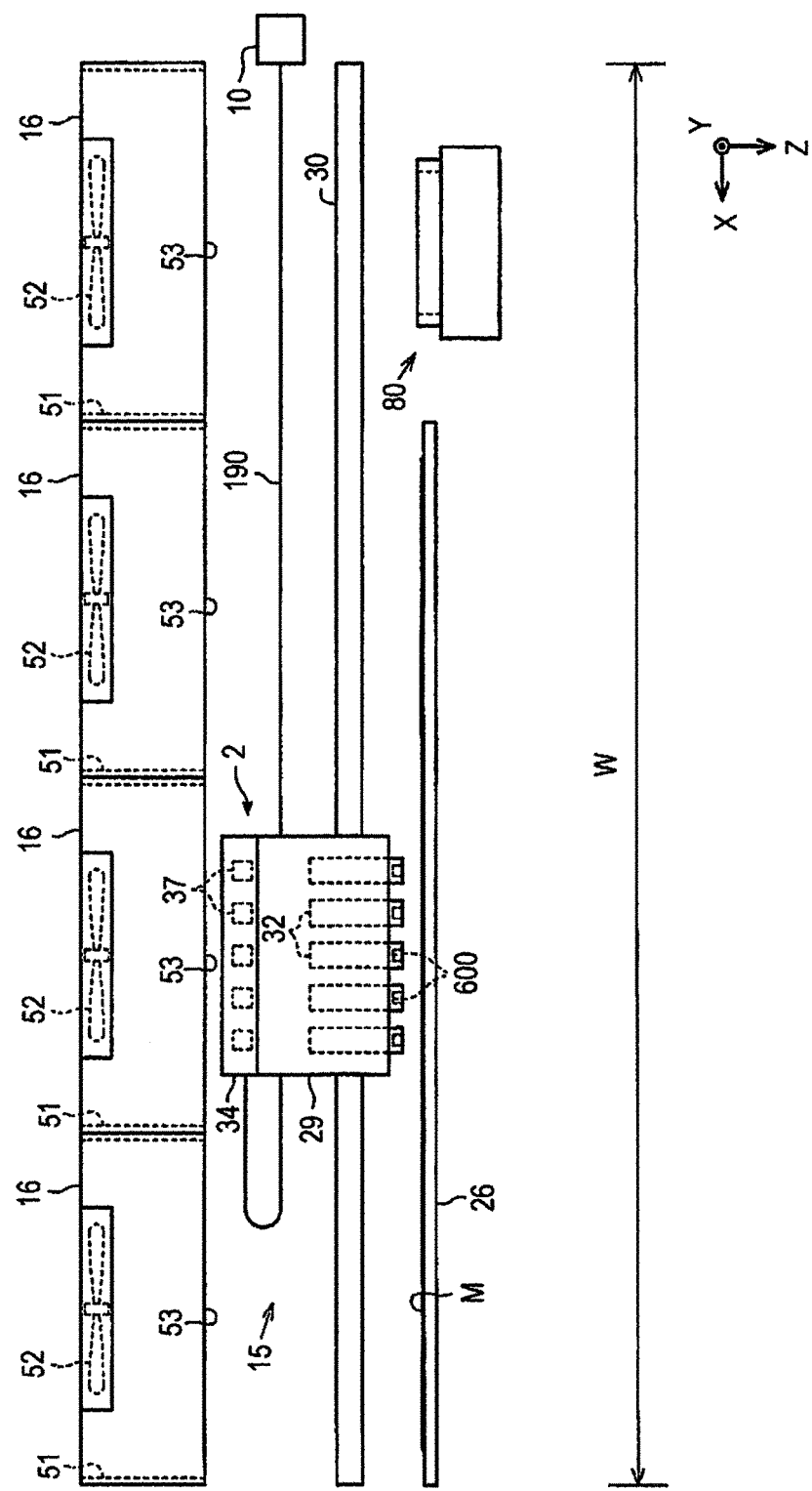
FIG. 2 is a front view illustrating an internal configuration of the liquid discharging apparatus.

FIG. 1 is a schematic side view illustrating a configuration of a liquid discharging apparatus 1. FIG. 2 is a front view illustrating an internal configuration of the liquid discharging apparatus 1.

As illustrated in FIG. 1, the liquid discharging apparatus 1 includes a delivering unit 12 that delivers a medium M, a supporting unit 13 that supports the medium M, a transporting unit 14 that transports the medium M, a printing unit 15 that performs printing onto the medium M, air-blowing units 16 that blow air toward the printing unit 15, and a control unit 10 that controls the configurations.

In the description below, a width direction of the liquid discharging apparatus 1 (direction perpendicular to the paper in FIG. 1) is referred to as a "first direction X", a depth direction of the liquid discharging apparatus 1 (right-and-left direction of the paper in FIG. 1) is referred to as a "second direction Y", a height direction of the liquid discharging apparatus 1 (up-and-down direction of the paper in FIG. 1) is referred to as a "third direction Z", and a direction in which the medium M is transported is referred to as a "transporting direction F". The first direction X, the second direction Y, and the third direction Z are directions that intersect (orthogonal to) one another, and the transporting direction F is a direction that intersects (orthogonal to) the first direction X.

The delivering unit 12 has a holding member 18 that rotatably holds a roll body R around which the medium M is wound. The holding member 18 holds different types of media M and roll bodies R having different sizes in the first direction X. The delivering unit 12 delivers the medium M unwound from the roll body R toward the supporting unit 13 by rotating the roll body R in one direction (counterclockwise direction in FIG. 1).

The supporting unit 13 includes, from an upstream transporting direction toward a downstream transporting direction, a first supporting unit 25, a second supporting unit 26, and a third supporting unit 27, which configure a transport path of the medium M. The first supporting unit 25 guides the medium M delivered from the delivering unit 12 toward the second supporting unit 26. The second supporting unit 26 supports the medium M, on which printing is to be performed. The third supporting unit 27 guides the printed medium M in the downstream transporting direction.

A heating unit 22 that heats the first supporting unit 25, the second supporting unit 26, and the third supporting unit 27 is provided on a side opposite to a transport path side of the medium M with respect to the first supporting unit 25, the second supporting unit 26, and the third supporting unit 27. By heating the first supporting unit 25, the second supporting unit 26, and the third supporting unit 27, the heating unit 22 indirectly heats the medium M supported by the first supporting unit 25, the second supporting unit 26, and the third supporting unit 27. The heating unit 22 is configured of, for example, a heating wire (heater wire).

The transporting unit 14 includes a transporting roller 23 that applies a transporting force to the medium M, a following roller 24 that presses the medium M down to the transporting roller 23, and a transporting motor 41 that drives the transporting roller 23. The transporting roller 23 and the following roller 24 are rollers of which axial directions are the first direction X.

The transporting roller 23 is disposed vertically below the transport path of the medium M, and the following roller 24 is disposed vertically above the transport path of the medium M. The transporting motor 41 is configured of, for example, a motor and a decelerator. The transporting unit 14 transports the medium M in the transporting direction F by rotating the transporting roller 23 in a state where the medium M is pinched between the transporting roller 23 and the following roller 24.

As illustrated in FIGS. 1 and 2, the printing unit 15 includes a guide member 30 that extends in the first direction X and a liquid discharging unit 2. The liquid discharging unit 2 includes a carriage 29 movably supported by the guide member 30 in the first direction X, a plurality of (N) head units 32 that are supported by the carriage 29 and discharge inks onto the medium M, and a plurality of (N) drive circuit units 37 that are supported by the carriage 29 and drive each of the N head units 32. The liquid discharging unit 2 further includes a control substrate 36 that controls communication with the control unit 10 and relays various types of signals between the control unit 10 and each of the drive circuit units 37 and a heat dissipating case 34 that accommodates each of the drive circuit units 37 and the control substrate 36.

The drive circuit units 37 are electrically connected to the control unit 10 via a flexible flat cable 190 and the control substrate 36.

The N head units 32 are supported in a state of being arrayed at regular intervals in the first direction X in a lower portion inside the carriage 29, and a lower end portion of each of the head units 32 protrudes toward the outside from a lower surface of the carriage 29. The lower surface of each of the head units 32 is opened in a state where a plurality of discharging units 600, from which inks are discharged, are arrayed in the second direction Y.

The printing unit 15 includes a carriage motor 31 that moves the carriage 29 in the first direction X and a maintenance unit 80 that maintains each of the head units 32.

The maintenance unit 80 is provided so as to be adjacent to the second supporting unit 26 in the first direction X. The maintenance unit 80 executes maintenance processing for returning the ink discharge states of the discharging units 600 to normal.

The air-blowing units 16 each have a duct 51 communicating with the outside of a housing 44 and a blower fan 52 provided inside the duct 51. The ducts 51 each have an air outlet 53 opened to a movement region W of the carriage 29.

The air outlets 53 of the ducts 51 are disposed so as to overlap the heat dissipating case 34 disposed on the carriage 29 in the third direction Z.

The plurality of air-blowing units 16 are provided vertically above the movement region W of the carriage 29 so as to be arranged along the movement region W (first direction X). Therefore, the air-blowing units 16 can blow air toward the entire area of the movement region W of the carriage 29. That is, the air-blowing units 16 are disposed along a movement path of the carriage 29, and function as airflow generating units that indirectly cool each of the drive circuit units 37 inside the heat dissipating case 34 by blowing air toward the heat dissipating case 34.

2. Electrical Configuration of Liquid Discharging Apparatus

Figure 3:
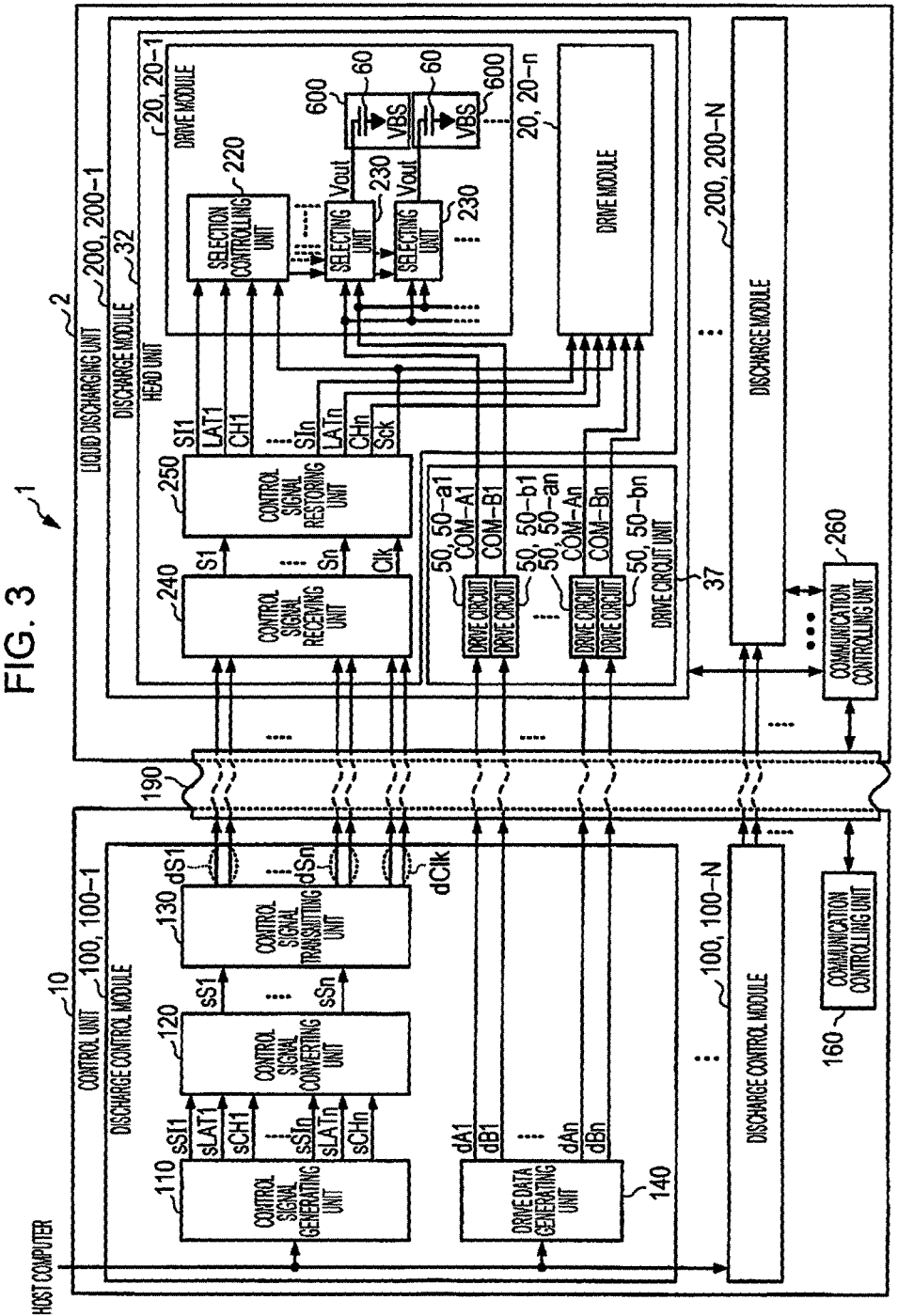
FIG. 3 is a block diagram showing an electrical configuration of the liquid discharging apparatus.

FIG. 3 is a block diagram showing an electrical configuration of the liquid discharging apparatus 1 of the embodiment. As shown in FIG. 3, the liquid discharging apparatus 1 includes the liquid discharging unit 2 (refer to FIGS. 1 and 2), the control unit 10 that controls the discharging of a liquid from the liquid discharging unit 2, and the flexible flat cable 190 that connects the control unit 10 and the liquid discharging unit 2 together.

The control unit 10 includes N discharge control modules 100 (100-1 to 100-N) and a communication controlling unit 160. The N discharge control modules 100 (100-1 to 100-N) have the same electrical configuration.

The N discharge control modules 100 (100-1 to 100-N) each have a control signal generating unit 110, a control signal converting unit 120, a control signal transmitting unit 130, and a drive data generating unit 140.

The control signal generating unit 110 outputs various types of control signals for controlling each unit when various types of signals, such as image data, are supplied from a host computer.

Specifically, the control signal generating unit 110 generates n (n≥1) original print data signals sSI1 to sSIn, n original latch signals sLAT1 to sLATn, and n original change signals sCH1 to sCHn, as a plurality of types of original control signals for controlling the discharging of liquids from the discharging units 600 based on various types of signals from a host computer, and outputs the signals to the control signal converting unit 120 in a parallel format. In the plurality of types of original control signals, some of the signals may not be included, or other signals may be included.

The control signal converting unit 120 converts (serializes) each of the original print data signal sSIi (i is any number of 1 to n), the original latch signal sLATi, and the original change signal sCHi, which are output from the control signal generating unit 110, to an original serial control signal sSi in one serial format and outputs the signal to the control signal transmitting unit 130.

The control signal transmitting unit 130 converts the n original serial control signal sS1 to sSn output from the control signal converting unit 120 to differential signals dS1 to dSn, each of which is configured of two signals, and transmits the differential signals dS1 to dSn to the liquid discharging unit 2 via the flexible flat cable 190. In addition, the control signal transmitting unit 130 generates a differential clock signal dClk used in high-speed serial data transmission of the differential signals dS1 to dSn via the flexible flat cable 190, and transmits the differential clock signal dClk to the liquid discharging unit 2 via the flexible flat cable 190. For example, the control signal transmitting unit 130 generates the differential signals dS1 to dSn and the differential clock signal dClk in a low voltage differential signaling (LVDS) transmission mode and transmits the signals to the liquid discharging unit 2. Since the amplitudes of the differential signals in the LVDS transmission mode are approximately 350 mV, high-speed data transmission can be realized. The control signal transmitting unit 130 may generate the differential signals dS1 to dSn and the differential clock signal dClk in various types of high-speed transmission modes other than LVDS, such as low voltage positive emitter coupled logic (LVPECL) and current mode logic (CML) and may transmit the signals to the liquid discharging unit 2.

The drive data generating unit 140 generates 2n drive data pieces dA1 to dAn and dB1 to dBn, which are underlying digital data pieces for drive signals for driving n drive modules 20 (20-1 to 20-n) included in the liquid discharging unit 2 based on various types of signals from a host computer, and transmits the data to the liquid discharging unit 2 via the flexible flat cable 190. In the embodiment, the drive data pieces dA1 to dAn and dB1 to dBn are digital data pieces obtained by converting waveforms of drive signals (drive waveforms) from analog to digital. The drive data pieces dA1 to dAn and dB1 to dBn may be digital data pieces indicating a difference with respect to the latest drive data, or may be digital data pieces that define a corresponding relationship between the length of each section where the slope of a drive waveform is constant and each slope.

The communication controlling unit 160 communicates with a communication controlling unit 260 included in the liquid discharging unit 2 via the flexible flat cable 190, and performs processing of setting various types of data and processing of reading various types of data with respect to the liquid discharging unit 2.

In addition to the processing described above, the control unit 10 performs processing of learning a scanning position (current position) of the carriage 29 (liquid discharging unit 2) and driving the carriage motor 31 based on the scanning position of the carriage 29. Accordingly, the movement of the carriage 29 in the first direction X is controlled. In addition, the control unit 10 performs processing of driving the transporting motor 41. Accordingly, the transporting direction F of the medium M is controlled.

The control unit 10 causes the maintenance unit 80 to execute maintenance processing for returning the ink discharge states of the discharging units 600 to normal. The maintenance unit 80 may have a cleaning mechanism for performing cleaning processing (pumping processing), in which thickened inks and bubbles in the discharging units 600 are suctioned by a tube pump (not illustrated) as maintenance processing. In addition, the maintenance unit 80 may have a wiping mechanism for performing wiping processing, in which foreign substances, such as paper dust stuck around nozzles of the discharging units 600, are wiped off by a wiping member, as maintenance processing.

The liquid discharging unit 2 includes a plurality of (N) discharge modules 200 (200-1 to 200-N) and the communication controlling unit 260. The N discharge modules 200 (200-1 to 200-N) have the same electrical configuration.

The N discharge modules 200 (200-1 to 200-N) each have the drive circuit unit 37 (refer to FIGS. 1 and 2) and the head unit 32 (refer to FIGS. 1 and 2). The discharge of a liquid is controlled by each of the N discharge control modules 100 (100-1 to 100-N) included in the control unit 10.

The drive circuit units 37 each have 2n drive circuits 50 (50-a1 to 50-an and 50-b1 to 50-bn). The n drive circuits 50-a1 to 50-an generate drive signals COM-A1 to COM-An for driving the drive modules 20-1 to 20-$n$, respectively, based on each of the drive data pieces dA1 to dAn output from the drive data generating unit 140. The n drive circuits 50-$b$1 to 50-$bn$ generate drive signals COM-B1 to COM-Bn for driving the drive modules 20-1 to 20-$n$, respectively, based on each of the drive data pieces dB1 to dBn output from the drive data generating unit 140. The 2n drive circuits 50 (50-$a$1 to 50-$an$ and 50-$b$1 to 50-$bn$) are different only in terms of an input drive data and an output drive signal and may be the same in terms of a circuit configuration.

The head units 32 each have a plurality of piezoelectric elements 60 (an example of a "first driving element" or an example of a "second driving element"), and discharge a liquid (ink) (an example of a "first liquid" or an example of a "second liquid") based on the drive signals COM-A1 to COM-An and COM-B1 to COM-Bn (an example of a "first drive signal" or an example of a "second drive signal") for driving the plurality of piezoelectric elements 60 and the differential signals dS1 to dSn and the differential clock signal dClk (an example of a "first control signal" or an example of a "second control signal") for controlling the application of the drive signals COM-A1 to COM-An and COM-B1 to COM-Bn to the plurality of piezoelectric elements 60. In the embodiment, the head units 32 each have the n drive modules 20 (20-1 to 20-$n$), a control signal receiving unit 240, and a control signal restoring unit 250.

The control signal receiving unit 240 receives the differential signals dS1 to dSn in the LVDS transmission mode transmitted from the control signal transmitting unit 130, differential-amplifies each of the received differential signals dS1 to dSn to convert to serial control signals S1 to Sn, and outputs the converted serial control signals S1 to Sn to the control signal restoring unit 250. The control signal receiving unit 240 receives the differential clock signal dClk in the LVDS transmission mode transmitted from the control signal transmitting unit 130, differential-amplifies the received differential clock signal dClk to convert to a clock signal Clk, and outputs the converted clock signal Clk to the control signal restoring unit 250. The control signal receiving unit 240 may receive the differential signals dS1 to dSn and the differential clock signal dClk in various types of high-speed transmission modes other than LVDS such as LVPECL and CML.

Based on the serial control signals S1 to Sn converted by the control signal receiving unit 240, the control signal restoring unit 250 generates the clock signal Sck, n print data signals SI1 to SIn, n latch signals LAT1 to LATn, and n change signals CH1 to CHn as a plurality of types control signals for controlling the discharging of liquids from the discharging units 600. Specifically, the control signal restoring unit 250 generates the print data signal SIi, the latch signal LATi, and the change signal CHi by restoring (deserializing) the original print data signal sSIi, the original latch signal sLATi, and the original change signal sCHi included in the serial control signal Si (i is any number of 1 to n) output from the control signal receiving unit 240, and outputs the signals to the drive module 20-$i$. In addition, the control signal restoring unit 250 performs predetermined processing (for example, processing of dividing at a predetermined division ratio) with respect to the clock signal Clk output from the control signal receiving unit 240, generates the clock signal Sck in synchronization with the print data signals SI1 to SIn, the latch signals LAT1 to LATn, and the change signals CH1 to CHn, and outputs the signals to the n drive modules 20 (20-1 to 20-$n$).

The n drive modules 20 (20-1 to 20-$n$) have the same configuration, and each have a selection controlling unit 220, m selecting units 230, and the m discharging units 600.

In the drive module 20-$i$ (i is any number of 1 to n), the selection controlling unit 220 instructs each of the selecting units 230 that which signal should be selected out of the drive signals COM-Ai and COM-Bi (or both of the signals should not be selected) by means of the clock signal Sck, the print data signal SIi, the latch signal LATi, and the change signal CHi output from the control signal restoring unit 250.

Each of the selecting units 230 selects from the drive signals COM-Ai and COM-Bi in accordance with the instruction from the selection controlling unit 220, outputs a drive signal Vout to the corresponding discharging unit 600, and applies the voltage to one end of the piezoelectric element 60 of the discharging unit 600. In addition, a reference voltage signal VBS is commonly applied to the other end of all of the piezoelectric elements 60. The piezoelectric elements 60 are provided so as to correspond to the discharging units 600 respectively, and are displaced by the drive signal Vout (drive signals COM-Ai and COM-Bi) being applied. The piezoelectric elements 60 are displaced according to a potential difference between the drive signal Vout (drive signals COM-Ai and COM-Bi) and the reference voltage signal VBS, and discharge liquids (inks). As described above, drive signals COM-Ai and COM-Bi are signals for driving each of the discharging units 600 to discharge liquids.

The drive signals COM-A1 to COM-An and COM-B1 to COM-Bn are high-voltage (tens of V) signals for driving the discharging units 600, and the n drive circuits 50 (50-$a$1 to 50-N and 50-$b$1 to 50-$bn$), which generate the drive signals COM-A1 to COM-An and COM-B1 to COM-Bn respectively, have high power consumption and are likely to reach a high temperature. In addition, when the waveforms of the drive signals COM-A1 to COM-An and COM-B1 to COM-Bn change according to the temperature properties of the drive circuits 50 (50-$a$1 to 50-N and 50-$b$1 to 50-$bn$), the accuracy of discharging liquids from the discharging units 600 is affected. Therefore, temperature sensors may be provided around the drive circuits 50-$a$1 to 50-N and 50-$b$1 to 50-$bn$, the discharge control modules 100 may receive output signals from the temperature sensors via the flexible flat cable 190, and the drive data pieces dA1 to dAn and dB1 to dBn may be generated such that the waveforms of the drive signals COM-A1 to COM-An and COM-B1 to COM-Bn are temperature-corrected based on the output signals from the temperature sensors. In addition, even when the waveforms of the drive signals COM-A1 to COM-An and COM-B1 to COM-Bn are temperature-corrected, discharge properties change according to the temperature properties of the piezoelectric elements 60. As a result, the accuracy of discharging a liquid is affected. Therefore, temperature sensors may be provided around the discharging units 600 (piezoelectric elements 60) (for example, around a nozzle plate 632 (refer to FIG. 4)), the discharge control modules 100 may receive output signals from the temperature sensors via the flexible flat cable 190, and the drive data pieces dA1 to dAn and dB1 to dBn may be generated such that a change in the temperature properties of the piezoelectric elements 60 are canceled out based on the output signals from the temperature sensors. The accuracy of discharging liquids from the discharging units 600 can be enhanced by the discharge control modules 100 performing processing.

The communication controlling unit 260 communicates with the communication controlling unit 160 included in the control unit 10 via the flexible flat cable 190, and performs processing of setting various types of data and processing of reading various types of data and transmitting the data to the communication controlling unit 160 with respect to the n discharge modules 200-1 to 200-N in accordance with a request from the communication controlling unit 160. Specifically, the communication controlling unit 260 performs various types of setting processing with respect to the drive circuit units 37 (for example, processing of adjusting a first reference voltage DAC_LV and a second reference voltage DAC_LV which are generated by a reference voltage generating unit 580 (refer to FIG. 11) included in each of the drive circuits 50) and processing of reading various types of data (for example, temperature data) indicating various types of states of the head units 32 and transmitting the data to the communication controlling unit 160.

Communication between the communication controlling unit 160 and the communication controlling unit 260 may be performed, for example, in the Inter-integrated Circuit (I2C) bus protocol, or may be performed in the Serial Peripheral Interface (SPI) bus protocol.

3. Configuration of Discharging Unit

Figure 4:
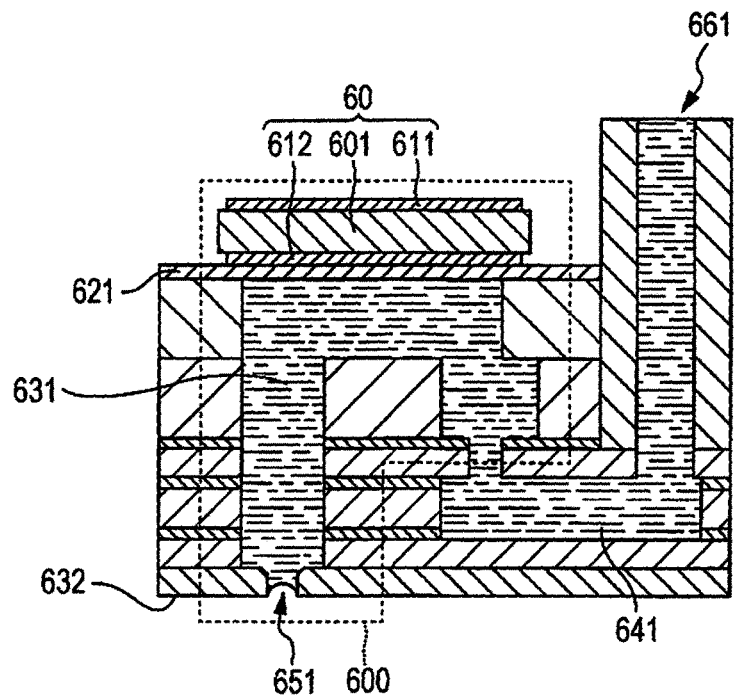
FIG. 4 is a view illustrating a configuration of a discharging unit.

FIG. 4 is a view illustrating a schematic configuration corresponding to one discharging unit 600 in the drive module 20. As illustrated in FIG. 4, the drive module 20 includes the discharging unit 600 and a reservoir 641.

The reservoir 641 is provided for each ink color, and an ink is introduced from a supply port 661 into the reservoir 641. An ink may be supplied from an ink cartridge mounted on the liquid discharging unit 2 to the supply port 661, or may be supplied independently of the liquid discharging unit 2 from an ink tank mounted on a main body side to the supply port 661 via an ink tube.

The discharging unit 600 includes the piezoelectric element 60, a vibrating plate 621, a cavity (pressure chamber) 631, and the nozzle 651. The vibrating plate 621 is displaced (bending vibration) by the piezoelectric element 60 provided at the top in the drawing, and functions as a diaphragm that increases/decreases the internal volume of the cavity 631 filled with an ink. The nozzle 651 is provided in a nozzle plate 632 and is an opening portion that communicates with the cavity 631. The cavity 631 is filled with a liquid (for example, an ink), and the internal volume of the cavity changes due to the displacement of the piezoelectric element 60. The nozzle 651 communicates with the cavity 631 and discharges the liquid in the cavity 631 as liquid droplets according to the change in the internal volume of the cavity 631.

The piezoelectric element 60 illustrated in FIG. 4 has a structure in which the piezoelectric body 601 is sandwiched between a pair of electrodes 611 and 612. A middle portion of the piezoelectric body 601 having this structure bends in an up-and-down direction with the electrodes 611 and 612 and the vibrating plate 621 with respect to both end portions in FIG. 4 according to a voltage applied by the electrodes 611 and 612. Specifically, when the value of the drive signal Vout becomes higher, the piezoelectric element 60 bends upwards, and when the value of the drive signal Vout becomes lower, the piezoelectric element bends downwards. In this configuration, since the internal volume of the cavity 631 increases when the piezoelectric element bends upwards, an ink is drawn into the reservoir 641. On the other hand, since the internal volume of the cavity 631 decreases when the piezoelectric element bends downwards, an ink is discharged from the nozzle 651 depending on the degree of decrease.

Without being limited to the illustrated structure, the piezoelectric element 60 may be in a form in which the piezoelectric element 60 is deformed and a liquid such as an ink can be discharged. In addition, without being limited to bending vibration, the piezoelectric element 60 may have a configuration where a so-called longitudinal vibration is used.

In addition, the piezoelectric element 60 is provided so as to correspond to the cavity 631 and the nozzle 651 in the drive module 20, and is provided so as to correspond to the selecting unit 230 as well. For this reason, a set of the piezoelectric element 60, the cavity 631, the nozzle 651, and the selecting unit 230 is provided for each nozzle 651.

4. Configuration of Drive Signal

In addition to a method for forming one dot by discharging ink droplets one time, there are a method for forming one dot (second method) by discharging ink droplets two or more times per unit time, landing one or more ink droplets discharged per unit time, and combining one or more landed ink droplets and a method for forming two or more dots (third method) without combining the two or more ink droplets, as a method for forming a dot onto the medium M.

In the embodiment, according to the second method, four gradations of a "large dot", a "medium dot", a "small dot", and a "non-recording (no dot)" are expressed for one dot by discharging an ink two times at maximum. In the embodiment, the two types of the drive signals COM-Ai and COM-Bi are prepared for the drive module 20-$i$ (i is any number of 1 to n) in order to express the four gradations, and each of the drive signals has the former half pattern and the latter half pattern in one period. A configuration where the drive signals COM-Ai and COM-Bi in the former half and the latter half of one period are selected (or not selected) according to a gradation to be expressed and the signals are supplied to the piezoelectric elements 60.

Figure 5:
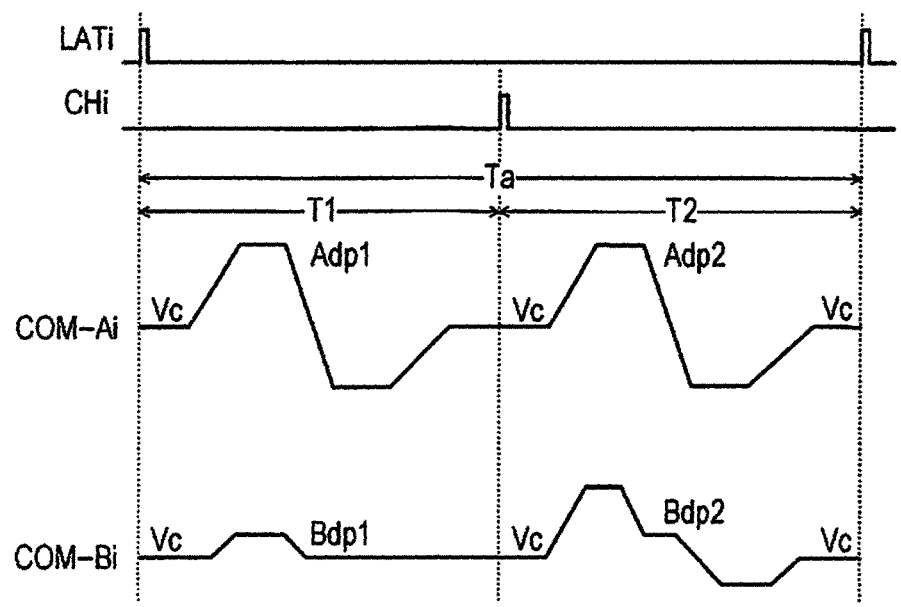
FIG. 5 is a diagram showing waveforms of drive signals.

FIG. 5 is a diagram showing the waveforms of the drive signals COM-Ai and COM-Bi. As shown in FIG. 5, the drive signal COM-Ai has a waveform, in which a trapezoidal waveform Adp1 disposed in a period T1 from the rise of the latch signal LATi to the rise of the change signal CHi is followed by a trapezoidal waveform Adp2 disposed in a period T2 from the rise of the change signal CHi to the next rise of the latch signal LATi. With a period formed of the period T1 and period T2 being as a period Ta, a new dot is formed onto the medium M for each period Ta.

In the embodiment, the trapezoidal waveforms Adp1 and Adp2 are waveforms that are almost the same. Each of the trapezoidal waveforms supplied to one end of the piezoelectric element 60 is a waveform, in which a predetermined amount of an ink, specifically, a medium amount of an ink is discharged from a nozzle 651 corresponding to the piezoelectric element 60.

The drive signal COM-Bi has a waveform, in which a trapezoidal waveform Bdp1 disposed in the period T1 is followed by a trapezoidal waveform Bdp2 disposed in the period T2. In the embodiment, the trapezoidal waveforms Bdp1 and Bdp2 are waveforms that are different from each other. The trapezoidal waveform Bdp1 is a waveform for vibrating an ink in the vicinity of the opening portion of the nozzle 651 and preventing an increase in the viscosity of the ink. For this reason, even when the trapezoidal waveform Bdp1 is supplied to one end of the piezoelectric element 60, ink droplets are not discharged from the nozzle 651 corresponding to the piezoelectric element 60. In addition, the trapezoidal waveform Bdp2 is a waveform that is different from the trapezoidal waveform Adp1 (Adp2). The trapezoidal waveform Bdp2 is a waveform in which a smaller amount of an ink than the predetermined amount described above is discharged from the nozzle 651 corresponding to the piezoelectric element 60 when the drive signal having this waveform is supplied to one end of the piezoelectric element 60.

Both of a voltage at start timing of the trapezoidal waveforms Adp1, Adp2, Bdp1, and Bdp2 and a voltage at end timing are the same, which is the voltage Vc. That is, each of the trapezoidal waveforms Adp1, Adp2, Bdp1, and Bdp2 is a waveform that starts with the voltage Vc and ends with the voltage Vc.

Figure 6:
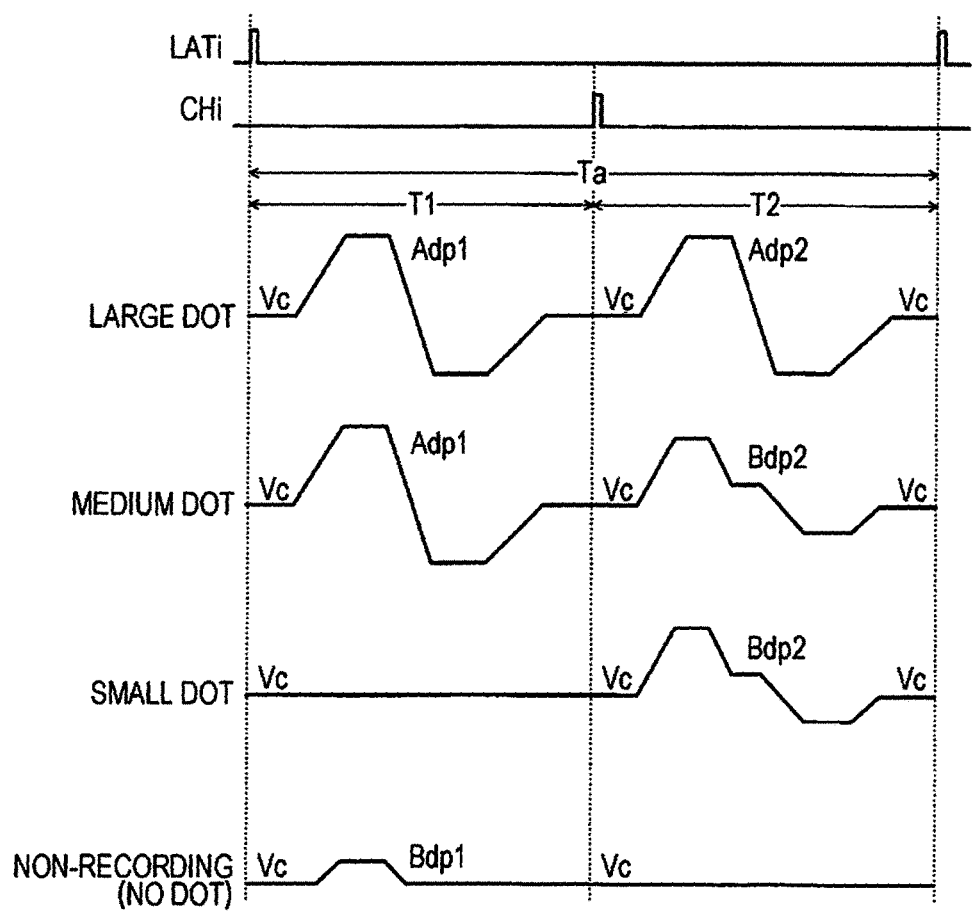
FIG. 6 is a diagram showing a waveform of a drive signal.

FIG. 6 shows a waveform of the drive signal Vout corresponding to each of the "large dot", the "medium dot", the "small dot", and the "non-recording".

As shown in FIG. 6, the drive signal Vout corresponding to the "large dot" has a waveform, in which the trapezoidal waveform Adp1 of the drive signal COM-Ai in the period T1 is followed by the trapezoidal waveform Adp2 of the drive signal COM-Ai in the period T2. When the drive signal Vout is supplied to one end of the piezoelectric element 60, a medium amount of an ink is discharged two times from the nozzle 651 corresponding to the piezoelectric element 60 in the period Ta. For this reason, each ink lands and coalesces to form a large dot on the medium M.

The drive signal Vout corresponding to the "medium dot" has a waveform, in which the trapezoidal waveform Adp1 of the drive signal COM-Ai in the period T1 is followed by the trapezoidal waveform Bdp2 of the drive signal COM-Bi in the period T2. When the drive signal Vout is supplied to one end of the piezoelectric element 60, a medium amount and a small amount of an ink is discharged two times from the nozzle 651 corresponding to the piezoelectric element 60 in the period Ta. For this reason, each ink lands and coalesces to form a medium dot on the medium M.

The drive signal Vout corresponding to the "small" has a waveform, in which the voltage Vc, which is a voltage immediately before being held constant due to a capacitive property of the piezoelectric element 60, in the period T1 is followed by the trapezoidal waveform Bdp2 of the drive signal COM-Bi in the period T2. When the drive signal Vout is supplied to one end of the piezoelectric element 60 in the period Ta, a small amount of an ink is discharged from the nozzle 651 corresponding to the piezoelectric element 60 only in the period T2. For this reason, an ink lands to form a small dot on the medium M.

The drive signal Vout corresponding to the "non-recording" has a waveform, in which the trapezoidal waveform Bdp1 of the drive signal COM-Bi in the period T1 is followed by the voltage Vc that is a voltage immediately before being held constant due to a capacitive property of the piezoelectric element 60 in the period T2. When the drive signal Vout is supplied to one end of the piezoelectric element 60 in the period Ta, the nozzle 651 corresponding to the piezoelectric element 60 vibrates slightly in the period T2 and an ink is not discharged. For this reason, an ink does not land and a dot is not formed on the medium M.

5. Configurations of Selection Controlling Unit and Selecting Unit

FIG. 7 is a diagram showing a configuration of the selection controlling unit 220. As shown in FIG. 7, the clock signal Sck, the print data signal SIi, the latch signal LATi, and the change signal CHi are supplied to the selection controlling unit 220. A set of a shift register (S/R) 222, a latch circuit 224, and a decoder 226 is provided in the selection controlling unit 220 so as to correspond to each of the piezoelectric elements 60' (nozzles 651).

The print data signal SIi is in total 2m bit signals including 2-bit print data (SIH, SIL) for selecting any one of the "large dot", the "medium dot", the "small dot", and the "non-recording" with respect to each of the m discharging units 600.

The print data signal SIi is serially supplied from the control signal restoring unit 250 in synchronization with the clock signal Sck. The shift register 222 is a configuration corresponding to each nozzle for temporarily holding print data for each of two bits of print data (SIH, SIL) included in the print data signal SIi.

Specifically, a configuration, in which the same number of the shift registers 222 as the number of stages that correspond to the piezoelectric elements 60 (nozzles) are cascade-connected to each other and the serially supplied print data signal SIi is subsequently transmitted to the next stage in accordance with the clock signal Sck, is adopted.

When the number of the piezoelectric elements 60 is m (m is a plural number), stages are expressed as a first stage, a second stage, . . . , and a mth stage in order of being on an upstream side where the print data signal SIi is supplied in order to differentiate between the shift registers 222.

Each of the m latch circuits 224 latches 2-bit print data (SIH, SIL) held by each of the m shift registers 222 at the rise of the latch signal LATi.

Each of the m decoders 226 decodes the 2-bit print data (SIH, SIL) latched by each of the m latch circuits 224, outputs selection signals Sa and Sb for each of the periods T1 and T2 defined by the latch signal LATi and the change signal CHi, and defines the selection from the selecting unit 230.

FIG. 8 is a diagram showing the contents of decoding by the decoder 226. For example, when the latched 2-bit print data (SIH, SIL) is (1, 0), the decoder 226 sets the logic levels of the selection signals Sa and Sb to levels H and L respectively in the period T1, and to levels L and H respectively in the period T2 and outputs the signals.

The logic levels of the selection signals Sa and Sb are shifted by a level shifter (not illustrated) to higher amplitude logic than the logic levels of the clock signal Sck, the print data signal SIi, the latch signal LATi, and the change signal CHi.

FIG. 9 is a diagram showing a configuration of the selecting unit 230 corresponding to one piezoelectric element 60 (nozzle 651).

As shown in FIG. 9, the selecting unit 230 has inverters (NOT gate) 232a and 232b and transfer gates 234a and 234b.

The selection signal Sa from the decoder 226 is supplied to a positive control end of the transfer gate 234a, to which a circle is not attached, while being logically inverted by the inverter 232a and being supplied to a negative control end of the transfer gate 234a, to which a circle is attached. Similarly, the selection signal Sb is supplied to a positive control end of the transfer gate 234b while being logically inverted by the inverter 232b and being supplied to a negative control end of the transfer gate 234b.

The drive signal COM-Ai is supplied to an input end of the transfer gate 234a and the drive signal COM-Bi is supplied to an input end of the transfer gate 234b. Output ends of the transfer gates 234a and 234b are commonly connected to each other, and the drive signal Vout is output to the discharging unit 600 via a common connection terminal.

When the selection signal Sa is at a level H, the transfer gate 234a electrically connects between the input end and the output end (switching on). When the selection signal Sa is at a level L, the transfer gate electrically disconnects between the input end and the output end (switching off). Similarly, the transfer gate 234b also switches on and off between the input end and the output end according to the selection signal Sb.

Next, operation of the selection controlling unit 220 and operation of the selecting unit 230 will be described with reference to FIG. 10.

The print data signal SIi is serially supplied from the control signal restoring unit 250 in synchronization with the clock signal Sck for each nozzle and is subsequently transmitted to the shift register 222 corresponding to each nozzle. When the supply of the clock signal Sck from the control signal receiving unit 240 stops, the 2-bit print data (SIH, SIL) corresponding to a nozzle comes to a state of being held in each of the shift registers 222. The print data signal SIi is supplied to the shift registers 222 corresponding to the nozzles at the last mth stage, . . . , the second stage, and the first stage in this in order.

When the latch signal LATi rises, each of the latch circuits 224 simultaneously latches 2-bit print data (SIH, SIL) held by the shift registers 222. In FIG. 10, LT1, LT2, . . . , and LTm indicate 2-bit print data (SIH, SIL) latched by the latch circuits 224 corresponding to the shift registers 222 at the first stage, the second stage, . . . , and the mth stage.

The decoder 226 outputs contents as shown in FIG. 8 such as the logic levels of the selection signals Sa and Sb in each of the periods T1 and T2 according to the size of a dot defined by the latched 2-bit print data (SIH, SIL).

That is, the decoder 226 sets the selection signals Sa and Sb to levels H and L in the period T1 and also to levels H and L in the period T2 in a case where the print data (SIH, SIL) is (1, 1) and the size of a dot is defined as a large dot. The decoder 226 sets the selection signals Sa and Sb to levels H and L in the period T1 and to levels L and H in the period T2 in a case where the print data (SIH, SIL) is (1, 0) and the size of a dot is defined as a medium dot. The decoder 226 sets the selection signals Sa and Sb to levels L and L in the period T1 and to levels L and H in the period T2 in a case where the print data (SIH, SIL) is (0, 1) and the size of a dot is defined as a small dot. The decoder 226 sets the selection signals Sa and Sb to levels L and H in the period T1 and to levels L and L in the period T2 in a case where the print data (SIR, SIL) is (0, 0) and non-recording is defined.

When the print data (SIH, SIL) is (1, 1), the selecting unit 230 selects the drive signal COM-Ai (trapezoidal waveform Adp1) since the selection signals Sa and Sb are at levels H and L in the period T1 and selects the drive signal COM-Ai (trapezoidal waveform Adp2) since the selection signals Sa and Sb are at levels H and L also in the period T2. As a result, the drive signal Vout corresponding to the "large dot" shown in FIG. 6 is generated.

When the print data (SIH, SIL) is (1, 0), the selecting unit 230 selects the drive signal COM-Ai (trapezoidal waveform Adp1) since the selection signals Sa and Sb are at levels H and L in the period T1, and selects the drive signal COM-Bi (trapezoidal waveform Bdp2) since the selection signals Sa and Sb are at levels L and H in the period T2. As a result, the drive signal Vout corresponding to the "medium dot" shown in FIG. 6 is generated.

When the print data (SIH, SIL) is (0, 1), the selecting unit 230 does not select both of the drive signals COM-Ai and COM-Bi since the selection signals Sa and Sb are at levels L and L in the period T1, and selects the drive signal COM-Bi (trapezoidal waveform Bdp2) since the selection signals Sa and Sb are at levels L and H in the period T2. As a result, the drive signal Vout corresponding to the "small dot" shown in FIG. 6 is generated. Although one end of the piezoelectric element 60 is opened since both of the drive signals COM-Ai and COM-Bi are not selected in the period T1, the drive signal Vout held at the immediately before voltage Vc due to a capacitive property of the piezoelectric element 60.

When the print data (SIH, SIL) is (0, 0), the selecting unit 230 selects the drive signal COM-Bi (trapezoidal waveform Bdp1) since the selection signals Sa and Sb are at levels L and H in the period T1, and does not select both of the drive signals COM-Ai and COM-Bi since the selection signals Sa and Sb are at levels L and L in the period T2. As a result, the drive signal Vout corresponding to the "non-recording" shown in FIG. 6 is generated. Although one end of the piezoelectric element 60 is opened since both of the drive signals COM-Ai and COM-Bi are not selected in the period T2, the drive signal Vout held at the immediately before voltage Vc due to a capacitive property of the piezoelectric element 60.

Figure 10:
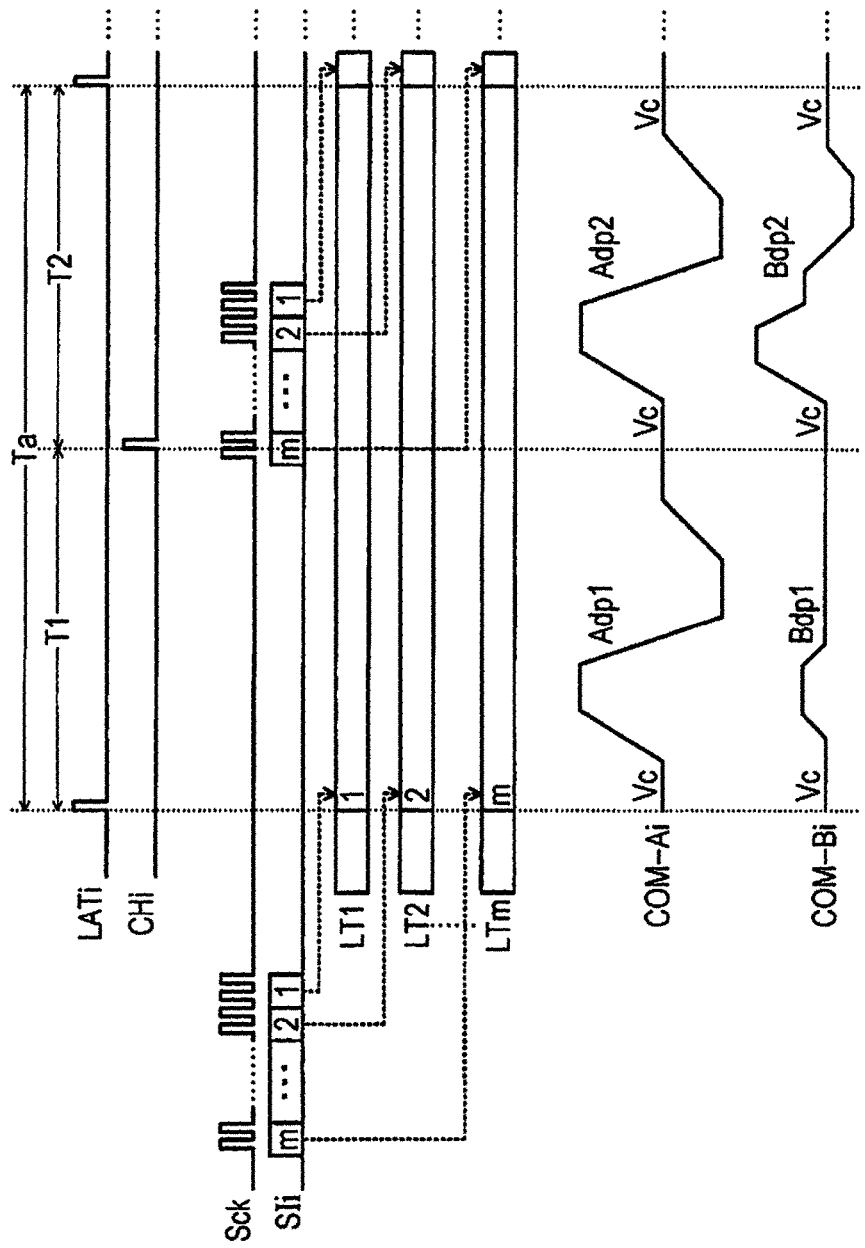
FIG. 10 is a diagram for illustrating operation of the selection controlling unit and the selecting unit.

The drive signals COM-Ai and COM-Bi shown in FIGS. 5 and 10 are merely examples. In reality, various combinations of waveforms prepared in advance according to the speed at which the liquid discharging unit 2 moves and the characteristics of the medium M are used.

Although an example in which the piezoelectric elements 60 bend upwards with a rise in the voltage has been described herein, the piezoelectric elements 60 bend downwards with a rise in the voltage when a voltage supplied to the electrodes 611 and 612 is reversed. For this reason, in a configuration where the piezoelectric elements 60 bend downwards with a rise in the voltage, the drive signals COM-Ai and COM-Bi given as examples in FIGS. 5 and 10 have waveforms which are reversed with the voltage Vc as reference.

6. Configuration of Drive Circuit

Next, the drive circuits 50-ai and 50-bi (i is any number of 1 to n) will be described. To describe one drive circuit 50-ai, out of the two drive circuits, the drive signal COM-Ai is generated as follows. That is, the drive circuit 50-ai, firstly, converts the drive data dAi supplied from the drive data generating unit 140 to analog, secondly, feeds the output drive signal COM-Ai back and corrects a deviation of a signal (attenuation signal), which is based on the drive signal COM-Ai, from a target signal, with a high-frequency component of the drive signal COM-Ai to generate a modulation signal in accordance with the corrected signal, thirdly, generates an amplified modulation signal by switching a transistor in accordance with the modulation signal, and fourthly, smoothes out (demodulates) the amplified modulation signal with a low pass filter to output the smoothed out signal as the drive signal COM-Ai.

The other drive circuit 50-bi has the same configuration, and is different only in terms of the fact that the drive signal COM-Bi is output from the drive data dBi. In the following FIG. 11, the drive circuits 50-ai and 50-bi will be described as the drive circuit 50 without differentiating between the two drive circuits.

Drive data to be input and a drive signal to be output are expressed with dAi (dBi) and COM-Ai (COM-Bi). In the case of the drive circuit 50-ai, it is expressed that the drive data dAi is input and the drive signal COM-Ai is output. In the case of the drive circuit 50-*bi*, it is expressed that the drive data dBi is input and the drive signal COM-Bi is output.

Figure 11:
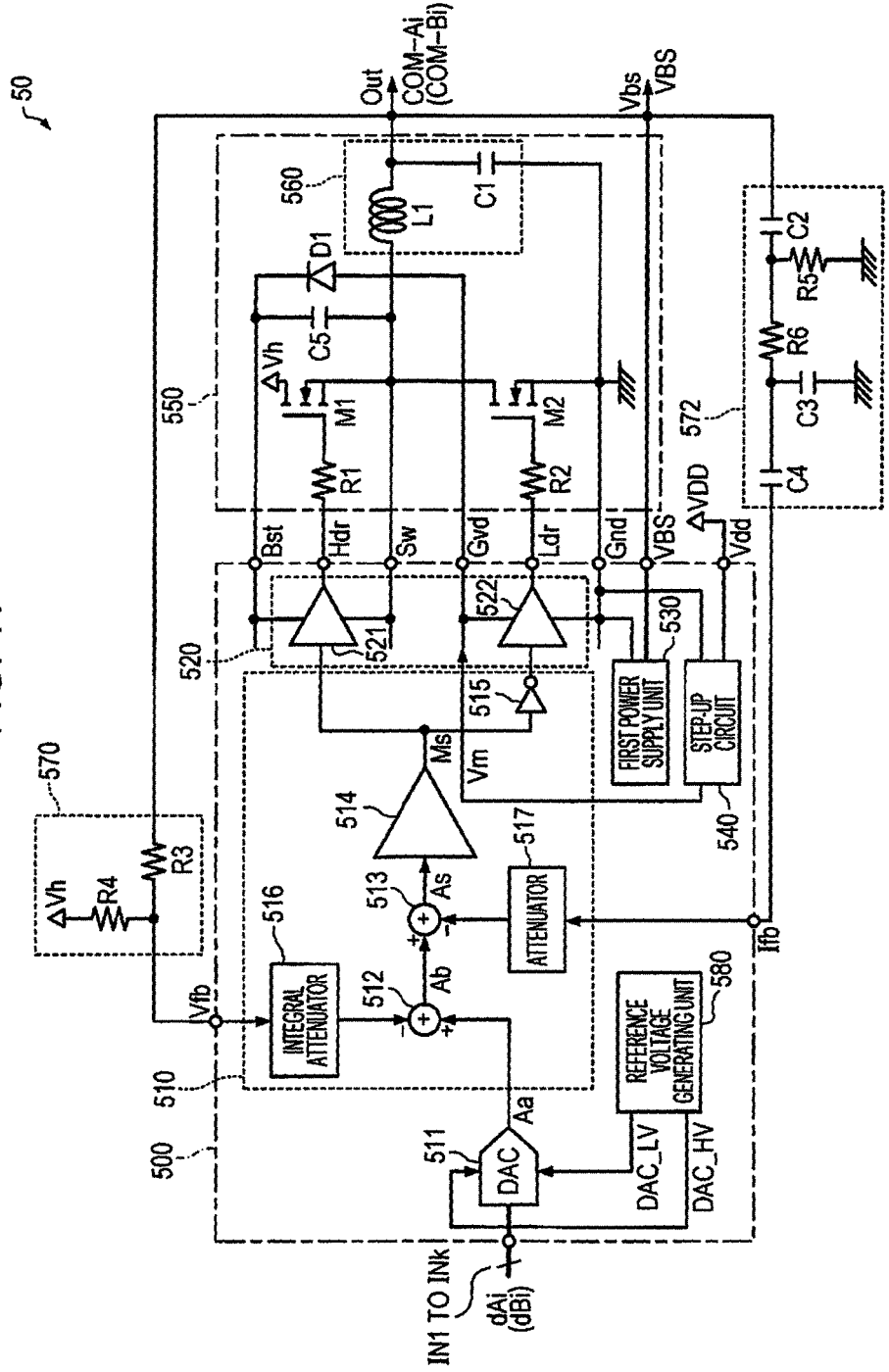
FIG. 11 is a diagram showing a circuit configuration of a drive circuit (capacitive load drive circuit).

FIG. 11 is a diagram showing a circuit configuration of the drive circuit (capacitive load drive circuit) 50. FIG. 11 shows a configuration for outputting the drive signal COM-Ai.

As shown in FIG. 11, the drive circuit 50 includes an integrated circuit device (integrated circuit device for driving a capacitive load) 500, an output circuit 550, a first feedback circuit 570, and a second feedback circuit 572.

The integrated circuit device 500 outputs a gate signal (amplified control signal) to each of a first transistor M1 and a second transistor M2 based on the k-bit drive data dAi (original signal) input via terminals IN1 to INk. For this reason, the integrated circuit device 500 includes a digital to analog converter (DAC) 511, an adder 512, an adder 513, a comparator 514, an integral attenuator 516, an attenuator 517, an inverter 515, a first gate driver 521, a second gate driver 522, a first power supply unit 530, a step-up circuit 540, and the reference voltage generating unit 580. In addition, the integrated circuit device 500 may include the first power supply unit 530.

The reference voltage generating unit 580 generates the first reference voltage DAC_HV (reference voltage on a high-voltage side) and the second reference voltage DAC_LV (reference voltage on a low-voltage side) and supplies the voltages to the DAC 511.

The DAC 511 converts the drive data dAi, in which the waveform of the drive signal COM-Ai is defined, to an original drive signal Aa, which is a voltage between the first reference voltage DAC_HV and the second reference voltage DAC_LV, and supplies the signal to an input end (+) of the adder 512. The maximum value and the minimum value of the voltage amplitude of the original drive signal Aa are determined by the first reference voltage DAC_HV and the second reference voltage DAC_LV (for example, approximately 1 to 2 V) respectively. When the voltage is amplified, the drive signal COM-Ai is obtained. That is, the original drive signal Aa is a target signal before the amplification of the drive signal COM-Ai.

The integral attenuator 516 attenuates and integrates a voltage from a terminal Out input via a terminal Vfb, that is, the drive signal COM-Ai to supply to an input end (−) of the adder 512.

The adder 512 supplies a signal Ab, which is an integrated voltage by deducting a voltage from the input end (−) from a voltage from the input end (+), to an input end (+) of the adder 513.

A power supply voltage of a circuit from the DAC 511 to the inverter 515 is 3.3 V (power supply voltage VDD supplied from a power supply terminal Vdd) with a low amplitude. For this reason, since there is a case where the voltage of the drive signal COM-Ai exceeds 40 V at maximum while the voltage of the original drive signal Aa is only approximately 2 V at maximum, the voltage of the drive signal COM-Ai is attenuated by the integral attenuator 516 in order to match amplitude ranges of both voltages when acquiring a deviation.

The attenuator 517 attenuates a high-frequency component of the drive signal COM-Ai input via a terminal Ifb to supply to an input end (−) of the adder 513. The adder 513 supplies a signal As, which is a voltage obtained by subtracting a voltage from the input end (−) from a voltage from the input end (+), to the comparator 514. A function of the attenuator 517 is to adjust modulation gain (sensitivity). That is, although the frequency of a modulation signal Ms and a duty ratio change in accordance with the drive data dAi (original signal), the attenuator 517 adjusts the change amounts of the frequency and the duty ratio.

The voltage of the signal As output from the adder 513 is a voltage obtained by deducting the attenuation voltage of a signal supplied to the terminal Vfb from the voltage of the original drive signal Aa and subtracting the attenuation voltage of a signal supplied to the terminal Ifb. For this reason, the voltage of the signal As output from the adder 513 can be referred to as a signal obtained by correcting a deviation of the attenuation voltage of the drive signal COM-Ai, which is output from the terminal Out, from the voltage of the original drive signal Aa, which is a target, with the high-frequency component of the drive signal COM-Ai.

The comparator 514 outputs the modulation signal Ms obtained by performing pulse-modulation as follows based on a subtraction voltage from the adder 513. Specifically, the comparator 514 outputs the modulation signal Ms, which is at a level H when the signal As output from the adder 513 is equal to or larger than a voltage threshold Vth1, in the case of a voltage rise, and outputs the modulation signal Ms, which is at a level L when the signal As falls short of a voltage threshold Vth2, in the case of a voltage drop. As will be described later, a voltage threshold is set so as to satisfy a relationship of Vth1>Vth2.

The modulation signal Ms from the comparator 514 is supplied to the second gate driver 522 through logic inversion by the inverter 515. The modulation signal Ms is supplied to the first gate driver 521 without going through logic inversion. For this reason, logic levels supplied to the first gate driver 521 and the second gate driver 522 are in a relationship exclusive to each other.

The logic levels supplied to the first gate driver 521 and the second gate driver 522 may be controlled in terms of timing such that, in reality, the logic levels do not come at a level H simultaneously (such that the first transistor M1 and the second transistor M2 are not turned on simultaneously). For this reason, in the strict sense, the term "exclusive" means that the logic levels do not simultaneously come at a level H (the first transistor M1 and the second transistor M2 are not turned on simultaneously).

Although the term "modulation signal" means the modulation signal Ms in the narrow sense, the negative signal of the modulation signal Ms is also included in the modulation signal, considering that pulse-modulation is performed according to the original drive signal Aa. That is, a modulation signal obtained by pulse-modulation according to the original drive signal Aa includes not only the modulation signal Ms but also a signal obtained by inverting the logic level of the modulation signal Ms and a signal controlled in terms of timing.

The adder 512, the adder 513, the comparator 514, the inverter 515, the integral attenuator 516, and the attenuator 517 function as a modulating unit 510 (an example of a "modulation circuit"), which modulates the original drive signal Aa and generates the modulation signal Ms.

The first gate driver 521 level-shifts a low logic amplitude, which is an output signal of the comparator 514, so as to be a high logic amplitude to output from a terminal Hdr. Out of power supply voltages of the first gate driver 521, a higher voltage is a voltage applied via a terminal Bst, and a lower voltage is a voltage applied via a terminal Sw. The terminal Bst is connected to one end of a capacitive element C5 and a cathode electrode of a diode D1 for backflow prevention. The terminal Sw is connected to a source electrode of the first transistor M1, a drain electrode of the second transistor M2, the other end of the capacitive element C5, and one end of an inductor L1. An anode electrode of the diode D1 is connected to one end of a terminal Gvd, and a voltage Vm (for example, 7.5 V) output by the step-up circuit 540 is applied thereto. Therefore, a potential difference between the terminal Bst and the terminal Sw is substantially equal to a potential difference between both ends of the capacitive element C5, that is, the voltage Vm (for example, 7.5 V).

The second gate driver 522 operates on a low electric potential side of the first gate driver 521. The second gate driver 522 level-shifts a low logic amplitude (level L: 0 V and level H: 3.3 V), which is an output signal of the inverter 515 to a high logic amplitude (for example, level L: 0 V and level H: 7.5 V) to output from a terminal Ldr. Out of power supply voltages of the second gate driver 522, the voltage Vm (for example, 7.5 V) is applied as a higher voltage, and zero voltage is applied via a ground terminal Gnd as a lower voltage. That is, the ground terminal Gnd is earthed to a ground. In addition, the terminal Gvd is connected to the anode electrode of the diode D1.

The first transistor M1 and the second transistor M2 are, for example, N-channel field effect transistors (FET). In the first transistor M1 on a high side, out of the two transistors, a voltage Vh (for example, 42 V) is applied to a drain electrode and a gate electrode is connected to a terminal Hdr via a resistance R1. In the second transistor M2 on a low side, a gate electrode is connected to the terminal Ldr via a resistance R2 and a source electrode is earthed to a ground.

Therefore, when the first transistor M1 is turned off and the second transistor M2 is turned on, the voltage of the terminal Sw is 0 V and the voltage Vm (for example, 7.5 V) is applied to the terminal Bst. On the other hand, when the first transistor M1 is turned on and the second transistor M2 is turned off, Vh (for example, 42 V) is applied to the terminal Sw and Vh+Vm (for example, 49.5 V) is applied to the terminal Bst.

That is, with the capacitive element C5 being as a floating power supply, the first gate driver 521 outputs an amplified control signal, of which a level L is approximately 0 V and a level H is approximately Vm (for example, 7.5 V), or, of which a level L is approximately Vh (for example, 42 V) and a level H is approximately Vh+Vm (for example, 49.5 V) since the reference electric potential (the electric potential of the terminal Sw) changes to 0 V or Vh (for example, 42 V) according to operation of the first transistor M1 and the second transistor M2. The second gate driver 522 outputs an amplified control signal, of which a level L is approximately 0 V and a level H is approximately Vm (for example, 7.5 V) since the reference electric potential (the electric potential of the ground terminal Gnd) is fixed at 0 V regardless of operation of the first transistor M1 and the second transistor M2.

The first gate driver 521 and the second gate driver 522 function as a gate driver 520 that generates an amplified control signal based on the modulation signal Ms. In addition, the first transistor M1 and the second transistor M2 function as an amplification circuit that generates an amplified modulation signal obtained by amplifying the modulation signal Ms.

The other end of the inductor L1 is the terminal Out, which is an output of the drive circuit 50, and the drive signal COM-Ai from the terminal Out is supplied to each of the selecting units 230.

The terminal Out is connected to each of one end of a capacitive element C1, one end of a capacitive element C2, and one end of a resistance R3. Out of the above elements, the other end of the capacitive element C1 is earthed to a ground. For this reason, the inductor L1 and the capacitive element C1 function as a low pass filter 560 (an example of a "demodulation circuit") that smooths out (demodulate) an amplified modulation signal, which appears at a connection point between the first transistor M1 and the second transistor M2, and generates a drive signal.

The other end of the resistance R3 is connected to the terminal Vfb and one end of a resistance R4, and the voltage Vh is applied to the other end of the resistance R4. Accordingly, the drive signal COM-Ai, which has passed through the first feedback circuit 570 (circuit configured of the resistance R3 and the resistance R4) from the terminal Out, is pulled up to be fed back to the terminal Vfb.

The other end of the capacitive element C2 is connected to one end of a resistance R5 and one end of a resistance R6. Out of the above resistances, the other end of the resistance R5 is earthed to a ground. For this reason, the capacitive element C2 and the resistance R5 function as a high pass filter that allows a high-frequency component of the drive signal COM-Ai from the terminal Out having frequency that is equal to or higher than cut-off frequency to pass through. The cut-off frequency of the high pass filter is set to, for example, approximately 9 MHz.

The other end of the resistance R6 is connected to one end of a capacitive element C4 and one end of a capacitive element C3. Out of the above elements, the other end of the capacitive element C3 is earthed to a ground. For this reason, the resistance R6 and the capacitive element C3 function as a low pass filter that causes a low-frequency component having frequency that is equal to or lower than cut-off frequency to pass through, out of signal components which have passed through the high pass filter. The cut-off frequency of the LPF is set to, for example, approximately 160 MHz.

Since the cut-off frequency of the high pass filter is set so as to be lower than the cut-off frequency of the low pass filter, the high pass filter and the low pass filter function as a band pass filter that allows a high-frequency component of the drive signal COM-Ai in a predetermined frequency range to pass through.

The other end of the capacitive element C4 is connected to the terminal Ifb of the integrated circuit device 500. Accordingly, out of high-frequency components of the drive signal COM-Ai that has passed through the second feedback circuit 572 (circuit configured of the capacitive element C2, the resistance R5, the resistance R6, the capacitive element C3, and the capacitive element C4), which functions as the band pass filter, a direct current component is cut and fed back to the terminal Ifb.

The drive signal COM-Ai output from the terminal Out is a signal obtained by smoothing out an amplified modulation signal at the connection point (terminal Sw) between the first transistor M1 and the second transistor M2 with a low pass filter configured of the inductor L1 and the capacitive element C1. Since the drive signal COM-Ai is fed back to the adder 512 after being integrated and subtracted via the terminal Vfb, self-oscillation occurs at frequency determined by a delay of feedback (a sum of a delay caused by smoothing-out of the inductor L1 and the capacitive element C1 and a delay caused by the integral attenuator 516) and a transfer function of the feedback.

However, since the amount of a delay through a feedback path via the terminal Vfb is large, there is a case where only the feedback via the terminal Vfb is not enough to make the frequency of self-oscillation higher as the accuracy of the drive signal COM-Ai can be sufficiently ensured.

Thus, by providing a path through which a high-frequency component of the drive signal COM-Ai is fed back via the terminal Ifb in addition to the path via the terminal Vfb, a delay can be made shorter from a perspective of the entire circuit in the embodiment. For this reason, the frequency of the signal As, which is obtained by adding a high-frequency component of the drive signal COM-Ai to the signal Ab, becomes higher as the accuracy of the drive signal can be sufficiently ensured, compared to a case where there is no path via the terminal Ifb.

Figure 12:
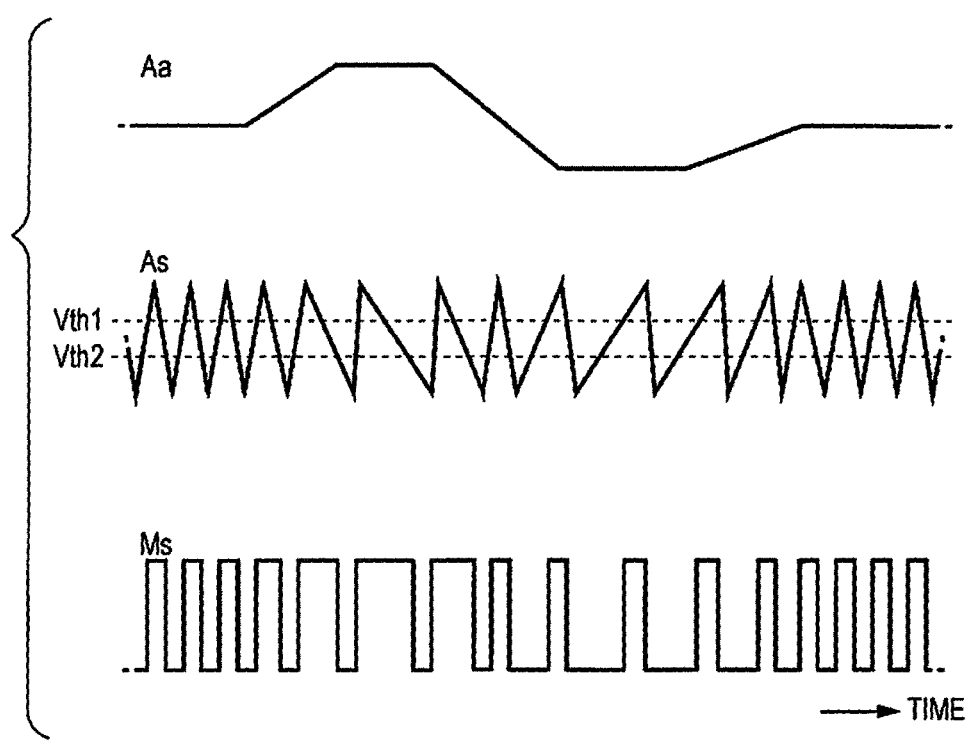
FIG. 12 is a diagram for illustrating operation of the drive circuit.

FIG. 12 is a diagram showing the waveform of the original drive signal Aa in association with the waveforms of the signal As and the modulation signal Ms.

As shown in FIG. 12, the signal As has a triangular wave, and the oscillation frequency thereof fluctuates according to the voltage (input voltage) of the original drive signal Aa. Specifically, the oscillation frequency becomes the highest in a case where an input voltage is an intermediate value. The oscillation frequency becomes lower as an input voltage becomes higher than the intermediate value or becomes lower than the intermediate value.

In addition, the upward inclination (rise of the voltage) and the downward inclination (drop of the voltage) of the triangular wave of the signal As are almost the same when an input voltage is close to an intermediate value. For this reason, the duty ratio of the modulation signal Ms, which is a result obtained by the comparator 514 comparing the signal As to the voltage thresholds Vth1 and Vth2, is almost 50%. When an input voltage becomes higher than the intermediate value, the downward inclination of the signal As becomes moderate. For this reason, a period for which the modulation signal Ms is at a level H becomes relatively longer and a duty ratio becomes higher. As an input voltage becomes lower than the intermediate value, the upward inclination of the signal As becomes moderate. For this reason, a period for which the modulation signal Ms is at a level H becomes relatively shorter and a duty ratio becomes lower.

For this reason, the modulation signal Ms is a pulse density modulation signal as follows. That is, the duty ratio of the modulation signal Ms is almost 50% when the input voltage has the intermediate value. As the input voltage becomes higher than the intermediate value, the duty ratio becomes higher. As the input voltage becomes lower than the intermediate value, the duty ratio becomes lower.

The first gate driver 521 turns the first transistor M1 on/off based on the modulation signal Ms. That is, the first gate driver 521 turns the first transistor M1 on when the modulation signal Ms is at a level H, and turns the first transistor off when the modulation signal Ms is at a level L. The second gate driver 522 turns the second transistor M2 on/off based on a logic inversion signal of the modulation signal Ms. That is, the second gate driver 522 turns the second transistor M2 off when the modulation signal Ms is at a level H, and turns the second transistor on when the modulation signal Ms is at a level L.

Therefore, the voltage of the drive signal COM-Ai, which is obtained by smoothing out the amplified modulation signal at the connection point between the first transistor M1 and the second transistor M2 with the inductor L1 and the capacitive element C1, becomes higher as the duty ratio of the modulation signal Ms becomes higher, and becomes lower as the duty ratio becomes lower. Consequently, the drive signal COM-Ai is controlled so as to be a signal obtained by increasing the voltage of the original drive signal Aa and is output.

Since pulse density modulation is used, the drive circuit 50 is advantageous in that the breadth of change in the duty ratio can be made larger compared to pulse width modulation in which modulation frequency is fixed.

That is, since a minimum positive pulse width and a minimum negative pulse width, which can be dealt by the entire circuit, are restricted by properties of the circuit, only a predetermined range (for example, a range of 10% to 90%) can be ensured as the breadth of change in the duty ratio in pulse width modulation when frequency is fixed. On the other hand, since oscillation frequency becomes lower as an input voltage moves away from the intermediate value in pulse density modulation, the duty ratio can be made larger in a region with a high input voltage and the duty ratio can be made smaller in a region with a low input voltage. For this reason, in self-oscillation pulse density modulation, a wider range (for example, a range of 5% to 95%) can be ensured as the breadth of change in the duty ratio.

The drive circuit 50 is a self-oscillation circuit that includes a signal path propagating the drive signal COM-Ai, the modulation signal Ms, and an amplified modulation signal and self-oscillates. A circuit that generates carrier waves having high frequency, such as forced-oscillation, is not necessary. For this reason, the drive circuit is advantageous in that it is easy to integrate circuits other than a circuit dealing with a high voltage, that is, a portion of the integrated circuit device 500.

Since there is not only a path via the terminal Vfb but also a path through which a high-frequency component is fed back via the terminal Ifb as feedback paths of the drive signal COM-Ai in the drive circuit 50, a delay from a perspective of the entire circuit becomes shorter. For this reason, since the frequency of self-oscillation becomes higher, the drive circuit 50 can accurately generate the drive signal COM-Ai.

Referring back to FIG. 11, in an example shown in FIG. 11, the resistance R1, the resistance R2, the first transistor M1, the second transistor M2, the capacitive element C5, the diode D1, and the low pass filter 560 configure the output circuit 550 that generates an amplified control signal based on a modulation signal and generates the drive signal COM-Ai based on the amplified control signal to output to a capacitive load (piezoelectric element 60).

The first power supply unit 530 applies a signal to a terminal that is different from a terminal to which a drive signal for the piezoelectric element 60 is applied. The first power supply unit 530 is configured of, for example, a constant voltage circuit such as a bandgap reference circuit. The first power supply unit 530 outputs a reference voltage signal VBS, which is a constant voltage (for example, 6 V), from a terminal Vbs. In the example shown in FIG. 11, the first power supply unit 530 generates the reference voltage signal VBS with a ground electric potential of the ground terminal Gnd being as reference.

The step-up circuit 540 supplies power to the gate driver 520. In the example shown in FIG. 11, the step-up circuit 540 steps up the power supply voltage VDD supplied from the power supply terminal Vdd with the ground electric potential of the ground terminal Gnd being as reference and generates the voltage Vm, which is a power supply voltage on a high electric potential side of the second gate driver 522. Although the step-up circuit 540 can be configured of a charge pump circuit and a switching regulator, a case where the step-up circuit is configured of a charge pump circuit can better suppress the generation of noise compared to a case where the step-up circuit is configured of the switching regulator. For this reason, since the drive circuit 50 can more accurately generate the drive signal COM-Ai and can control a voltage applied to the piezoelectric element 60 with high accuracy, the accuracy of discharging a liquid can be improved. Since a power generating unit of the gate driver 520 is miniaturized by configuring the step-up circuit of the charge pump circuit, it is possible to mount the gate driver on the integrated circuit device 500, and the entire area of the drive circuit 50 can be significantly reduced compared to a case where the power generating unit of the gate driver 520 is configured outside the integrated circuit device 500.

In addition to the integrated circuit device 500, the drive circuit unit 37 includes a power supply voltage generation circuit to generate a voltage (the voltage Vh and the power supply voltage VDD) necessary for operation of each of the drive circuits 50. The first power supply unit 530 and the step-up circuit 540 may be included in this power supply generation circuit.

7. Structure of Liquid Discharging Unit

Figure 13:
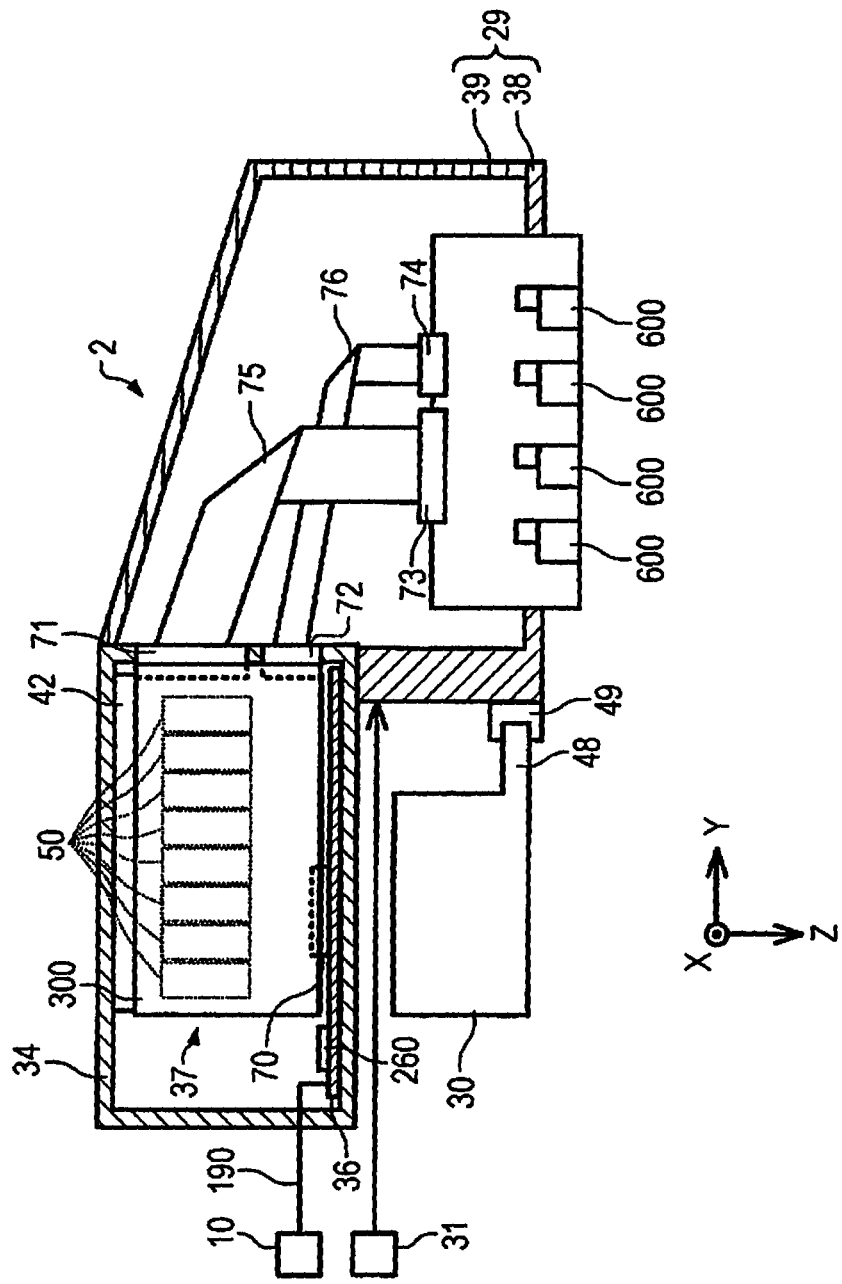
FIG. 13 is a schematic side view illustrating a configuration on the periphery of a liquid discharging unit.
Figure 14:
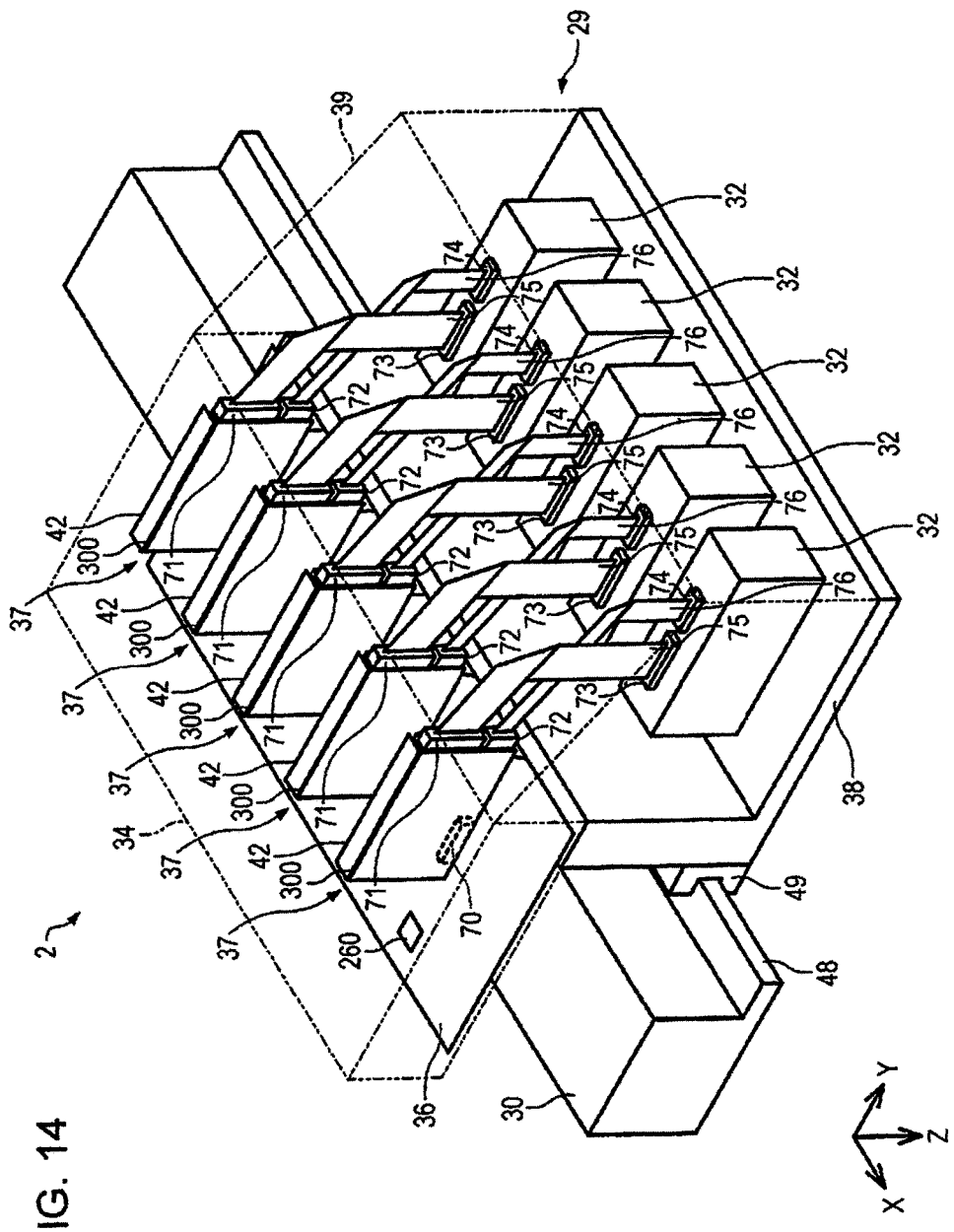
FIG. 14 is a schematic perspective view illustrating an internal configuration of the liquid discharging unit.

FIG. 13 is a schematic side view illustrating a configuration on the periphery of the liquid discharging unit 2 in the embodiment. FIG. 14 is a schematic perspective view illustrating an internal configuration of the liquid discharging unit 2.

As illustrated in FIG. 13, the carriage 29 includes a carriage main body 38, of which a section when seen in the first direction X is in a L-shape, and a cover member 39, which is attachably/detachably mounted with respect to the carriage main body 38 and forms a closed space with the carriage main body 38.

As illustrated in FIGS. 13 and 14, a front end portion of the rectangular heat dissipating case 34 accommodating each of the drive circuit units 37 and the control substrate 36 is fixed to an upper end portion of a rear portion of the carriage 29. Therefore, each of the drive circuit units 37 and the control substrate 36 are supported by the carriage 29 via the heat dissipating case 34. Each of the drive circuit units 37 is supported in a state of being arrayed at regular intervals in the first direction X in the heat dissipating case 34.

Each of the drive circuit units 37 has a drive circuit substrate 300 (an example of a "circuit substrate") and a heat dissipating plate 42, and various types of circuit components (not illustrated) that configure the drive circuits 50.

The flexible flat cable 190 is connected to the control substrate 36. The communication controlling unit 260 (for example, a microcontroller IC) is mounted on the control substrate 36. The plurality of (N) drive circuit substrates 300 are connected to the control substrate 36. In particular, in the embodiment, a surface (drive circuit mounted surface) of each of the drive circuit substrates 300, on which the N drive circuits 50 (50-a1 to 50-an and 50-b1 to 50-bn) are mounted, is connected to the control substrate 36 in a direction intersecting a surface of the control substrate 36 to which the drive circuit substrate 300 is connected. Due to such a connection structure, a region of the control substrate 36 where the drive circuit substrate 300 is connected is smaller and the plurality of (N) drive circuit units 37 can be mounted at high density on the carriage 29.

A connector 70 is provided on a surface of each of the drive circuit substrate 300 on a side opposite to the drive circuit mounted surface. Each drive circuit substrate 300 is attachably/detachably (pluggably) connected to the control substrate 36 via the connector 70. Due to such a connection structure, it is possible to easily replace the drive circuit substrate 300, which is a replacement target, in a case where replacement of each drive circuit substrate 300 is necessary.

Each heat dissipating plate 42 is mounted on a surface on a side opposite to the drive circuit mounted surface of each drive circuit substrate 300, and releases heat generated at each portion of each of the drive circuit units 37. On the surface on a side opposite to the drive circuit mounted surface of each drive circuit substrate 300, there is a large empty region (flat region), compared to the drive circuit mounted surface, even if, for example, a capacitor for stabilizing power supply is mounted in addition to connectors 70, 71, and 72. For example, a heat transmitting sheet (not illustrated) is attached in close contact with the free region and the heat dissipating plate 42 is fixed to the drive circuit substrate 300 in a state of being in contact with the heat transmitting sheet. Accordingly, the heat of the drive circuit substrate 300 is efficiently transmitted to the heat transmitting sheet and the heat dissipating plate 42 since an area where the heat dissipating plate 42 and the heat transmitting sheet are in contact with each other can be made larger. In the embodiment, each heat dissipating plate 42 is in contact with the heat dissipating case 34 accommodating each drive circuit substrate 300, and the heat transmitted to the heat dissipating plate 42 is efficiently transmitted to the heat dissipating case 34. Therefore, a possibility that a failure occurs at the drive circuits 50-a1 to 50-an and 50-b1 to 50-bn of each of the drive circuit units 37 due to heat generation and the drive signals COM-A1 to COM-An and COM-Bi to COM-Bn degrade can be reduced. Since each heat dissipating plate 42 is mounted on the surface on a side opposite to the drive circuit mounted surface of each drive circuit substrate 300, the drive circuits 50-a1 to 50-an and 50-b1 to 50-bn can be stably operated without applying stress from the heat dissipating plate 42.

Since the heat dissipating case 34 and each heat dissipating plate 42 efficiently dissipate heat generated at each of the drive circuit units 37 to the outside, it is preferable to adopt the following configuration. That is, it is preferable to make an area where the heat dissipating case 34 and each heat dissipating plate 42 are in contact with each other large since the amount of heat transmitted from each heat dissipating plate 42 to the heat dissipating case 34 becomes larger. In addition, since the heat dissipating case 34 and each heat dissipating plate 42 are likely to transmit heat, it is preferable to make the heat dissipating case and each heat dissipating plate of metal having high thermal conductivity such as aluminum. In order to make the amount of heat dissipated from the heat dissipating case 34 to the open air larger, a heat dissipating fan may be provided on an outside of the heat dissipating case 34. In this case, it is preferable to make an area for a heat dissipating fan in contact with the open air large.

Each drive circuit substrate 300 is connected to the control unit 10 via the flexible flat cable 190 and the connector 70, and the differential signals dS1 to dSn, the differential clock signal dClk, and the drive data pieces dA1 to dAn and dB1 to dBn are input from the control unit 10. In addition, each drive circuit substrate 300 is connected to the communication controlling unit 260 via the connector 70, various types of signals for communication are input from the communication controlling unit 260, and various types of signals for communication are output to the communication controlling unit 260. That is, a plurality of control signal input terminals, into which each of the differential signals dS1 to dSn and the differential clock signal dClk is input, a plurality of drive signal input terminals, into which each of the drive data pieces dA1 to dAn and dB1 to dBn is input, and a plurality of terminals for communication are provided in the connector 70.

The connector 71 and the connector 72 are provided on the surface on a side opposite to the drive circuit mounted surface of each drive circuit substrate 300, and the connectors 71 and 72 are exposed from a front surface of the heat dissipating case 34 to the inside of the carriage 29. Each of the head units 32 has a connector 73 and a connector 74 on an upper surface thereof. One end portion of a connection cable 75 that is configured of, for example, a flexible flat cable (FFC) is attachably/detachably (pluggably) connected to the connector 71, and the other end portion of the connection cable 75 is attachably/detachably connected to the connector 73. Similarly, one end portion of a connection cable 76 that is configured of, for example, a FFC is attachably/detachably (pluggably) connected to the connector 72, and the other end portion of the connection cable 76 is attachably/detachably connected to the connector 74. That is, each of the drive circuit substrates 300 and each of the head units 32 are electrically connected to each other via the two connection cables 75 and 76.

The drive circuit substrate 300 outputs the drive signals COM-A1 to COM-An and COM-B1 to COM-Bn, the reference voltage signal VBS, and various types of signals for communication to the head unit 32 via the connector 71 and the connection cable 75, and various types of signals for communication are input from the head unit 32. That is, a plurality of drive signal output terminals, which output each of the drive signals COM-A1 to COM-An and COM-B1 to COM-Bn, and the plurality of terminals for communication are provided in the connector 71.

The drive circuit substrate 300 outputs the differential signals dS1 to dSn and the differential clock signal dClk to the head unit 32 via the connector 72 and the connection cable 76. That is, a control signal output terminal, which outputs each of the differential signals dS1 to dSn and the differential clock signal dClk, is provided in the connector 72. As described above, in the embodiment, since the amplitude is small (for example, hundreds of mV), the differential signals dS1 to dSn and the differential clock signal dClk, which are likely to encounter interference from other signals, are transmitted to the head unit 32 by the connection cable 76 connected to the connector 72, in addition to the connection cable 75 that is connected to the connector 71 and transmits the drive signals COM-A1 to COM-An and COM-B1 to COM-Bn and various types of signals for communication to the head unit 32. Thus, a possibility that the differential signals dS1 to dSn and the differential clock signal dClk degrade is reduced.

A plurality of drive data transmitting wiring pieces that respectively transmit the drive data dA1 to dAn from the connector 70 to the drive circuits 50-a1 to 50-an and 50-b1 to 50-bn and a plurality of drive signal transmitting wiring pieces that respectively transmit the drive signals COM-A1 to COM-An and COM-B1 to COM-Bn from the drive circuits 50-a1 to 50-an and 50-b1 to 50-bn to the connector 71 are provided on the drive circuit substrate 300. Reference voltage signal transmitting wiring that commonly transmits the reference voltage signal VBS from the drive circuits 50-a1 to 50-an and 50-b1 to 50-bn to the connector 71 is provided on the drive circuit substrate 300. A plurality of signal for communication transmitting wiring pieces that transmit various types of signals for communication are provided between the connector 70 and the drive circuits 50-a1 to 50-an and 50-b1 to 50-bn or the connector 71 on the drive circuit substrate 300. In addition, a plurality of control signal transmitting wiring pieces that respectively transmit the differential signals dS1 to dSn and the differential clock signal dClk from the connector 70 to the connector 72 are provided on the drive circuit substrate 300.

The head unit 32 discharges an ink by means of the discharging units 600 based on the differential signals dS1 to dSn, the differential clock signal dClk, and the drive signals COM-A1 to COM-An and COM-B1 to COM-Bn.

The guide member 30 has a guide rail portion 48 extending in the first direction X, on a front lower portion thereof. The carriage 29 is movably supported by the guide rail portion 48 in the first direction X on a carriage supporting unit 49 provided on a rear lower portion of the carriage. That is, the carriage supporting unit 49 is slidably connected to the guide rail portion 48 in the first direction X. The carriage 29 supports the head units 32 including the discharging units 600 and the heat dissipating case 34 including the drive circuit units 37, and reciprocates in the first direction X while being guided by the guide rail portion 48 of the guide member 30 on the carriage supporting unit 49 by driving of the carriage motor 31.

As described above, in the embodiment, the control substrate 36, each of the drive circuit units 37 (drive circuit substrates 300), and each of the head units 32 are mounted on the movable carriage 29. Since the considerably long flexible flat cable 190 propagates the drive signals COM-A1 to COM-An and COM-B1 to COM-Bn in a case where each of the drive circuit units 37 is not mounted on the carriage 29, large overshoot and ringing occur in a drive waveform and the accuracy of discharging a liquid from each of the head units 32 degrades. In the embodiment, since each of the drive circuit units 37 is mounted on the carriage 29, the length of wiring that propagates the drive signals COM-A1 to COM-An and COM-B1 to COM-Bn to the piezoelectric elements 60 is shorter. Since the occurrence of overshoot and ringing in a drive waveform can be decreased, it is possible to accurately discharge a liquid from each of the head units 32.

The carriage 29 is positioned on a front side portion of the guide member 30, and the heat dissipating case 34 accommodating each of the drive circuit units 37 is positioned above the guide member 30. Accordingly, the rotation moment of the carriage 29, of which a fulcrum is the carriage supporting unit 49, is suppressed to be small, and the lengths of the connection cables 75 and 76 can be made smaller. Therefore, the weight balance of the carriage 29 is stable and a signal output from each of the drive circuit units 37 to each of the head units 32 is stable.

8. Configuration of Drive Circuit Substrate

Figure 15:
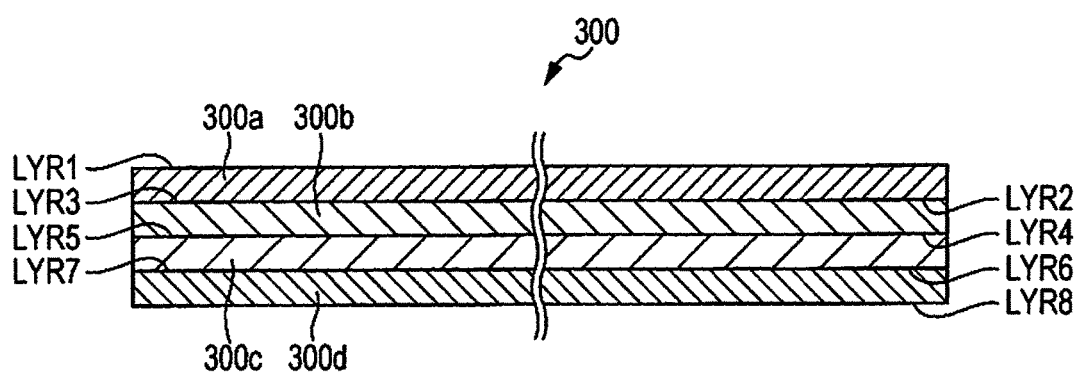
FIG. 15 is a side view of a drive circuit substrate.

FIG. 15 is a side view of the drive circuit substrate 300 in the embodiment. As illustrated in FIG. 15, the drive circuit substrate 300 is a multi-layer substrate obtained by stacking four substrates 300a, 300b, 300c, and 300d. Various types of wiring pieces and through-holes (not illustrated) are formed in an upper surface (upper surface in FIG. 15) and a back surface (lower surface in FIG. 15) of each of the substrates 300a, 300b, 300c, and 300d. The front surface and the back surface of the substrate 300a correspond to a first wiring layer LYR1 and a second wiring layer LYR2, respectively. The front surface and the back surface of the substrate 300b correspond to a third wiring layer LYR3 and a fourth wiring layer LYR4, respectively. The front surface and the back surface of the substrate 300c correspond to a fifth wiring layer LYR5 and a sixth wiring layer LYR6, respectively. The front surface and the back surface of the substrate 300d correspond to a seventh wiring layer LYR7 and an eighth wiring layer LYR8, respectively. The first wiring layer LYR1 and the eighth wiring layer LYR8 correspond to the drive circuit mounted surface of the drive circuit substrate 300 and a surface on a side opposite thereto, respectively.

Hereinafter, a case where the eight drive circuits 50-a1 to 50-a4 and 50-b1 to 50-b4 are provided on the drive circuit substrate 300 (in the case of n=4) is given as an example, and a configuration of a part of a wiring layer will be described with reference to FIG. 16 to FIG. 20. FIG. 16 to FIG. 20 illustrate only a part of circuit components, such as wiring and through-holes. In addition, FIG. 17 to FIG. 20 are views obtained by seeing through the second wiring layer LYR2, the third wiring layer LYR3, the fourth wiring layer LYR4, and the eighth wiring layer LYR8, respectively, from a front surface side of the drive circuit substrate 300 (first wiring layer LYR1 side). Although not illustrated, various types of wiring pieces and through-holes are also provided in the fifth wiring layer LYR5, the sixth wiring layer LYRE, and the seventh wiring layer LYR7 of the drive circuit substrate 300.

Figure 16:
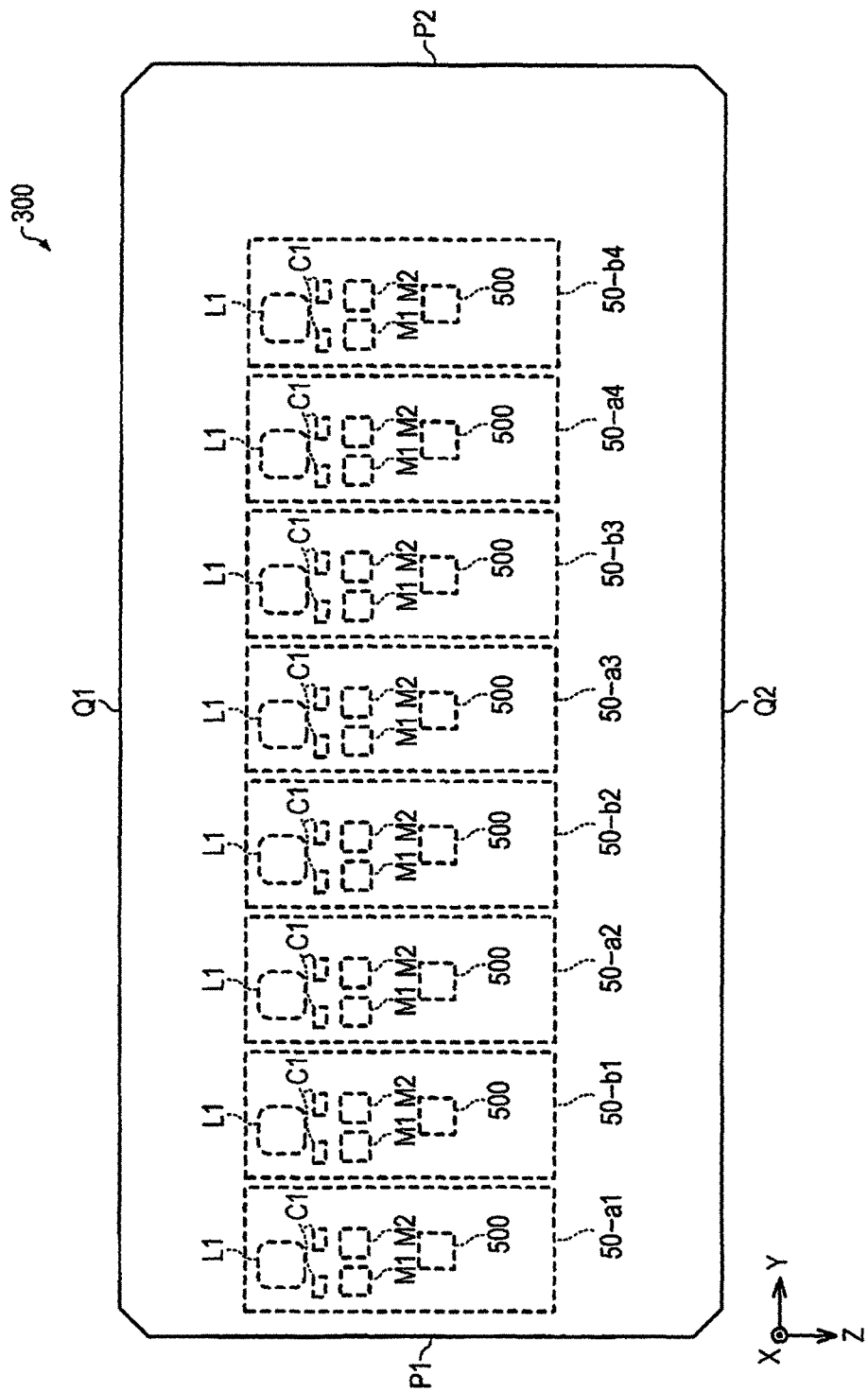
FIG. 16 is a view schematically illustrating an example of a configuration of a first wiring layer of the drive circuit substrate.

FIG. 16 is a view schematically illustrating an example of a configuration of the first wiring layer LYR1 of the drive circuit substrate 300. As illustrated in FIG. 16, the drive circuit 50-a1 (an example of a "first drive circuit") that outputs the drive signal COM-A1, the drive circuit 50-b1 (an example of a "first drive circuit") that outputs the drive signal COM-B1, the drive circuit 50-a2 (an example of a "second drive circuit") that outputs the drive signal COM-A2, the drive circuit 50-b2 (an example of a "second drive circuit") that outputs the drive signal COM-B2, the drive circuit 50-a3 (an example of a "second drive circuit") that outputs the drive signal COM-A3, the drive circuit 50-b3 (an example of a "second drive circuit") that outputs the drive signal COM-B3, the drive circuit 50-a4 (an example of a "first drive circuit") that outputs the drive signal COM-A4, and the drive circuit 50-b4 (an example of a "first drive circuit") that outputs the drive signal COM-B4 are arranged in a line on the first wiring layer LYR1 in a direction (second direction Y) from a short side P1 to a short side P2 of the substantially rectangular drive circuit substrate 300.

Figure 17:
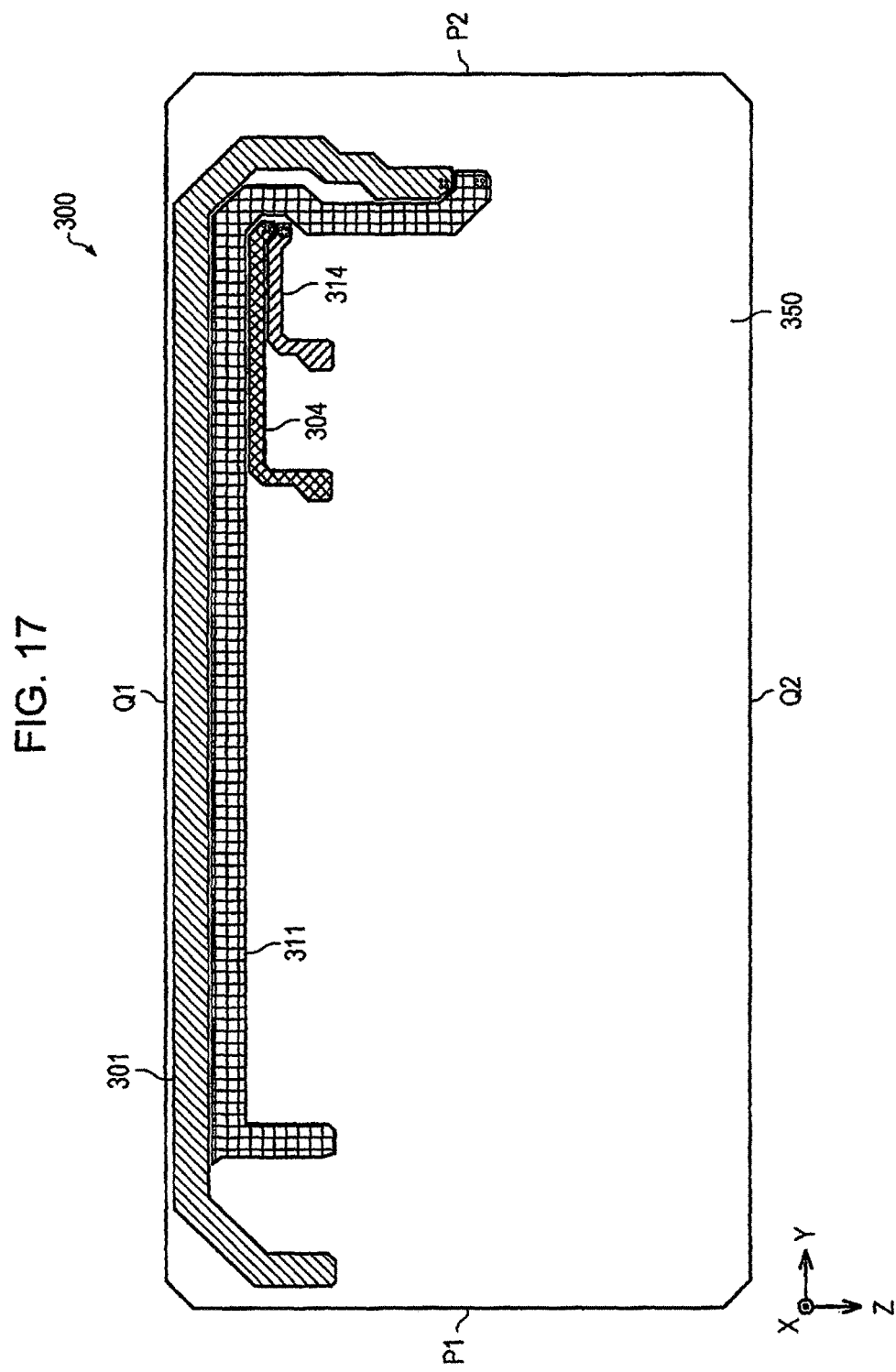
FIG. 17 is a view schematically illustrating an example of a configuration of a second wiring layer of the drive circuit substrate.

FIG. 17 is a view schematically illustrating an example of a configuration of the second wiring layer LYR2 of the drive circuit substrate 300 and is a view obtained by seeing through the second wiring layer LYR2 from the front surface side of the drive circuit substrate 300 (first wiring layer LYR1 side). As illustrated in FIG. 17, drive signal transmitting wiring 301 (an example of "first drive signal transmitting wiring") that transmits the drive signal COM-A1 (an example of a "first drive signal", drive signal transmitting wiring 311 (an example of "first drive signal transmitting wiring") that transmits the drive signal COM-B1 (an example of a "first drive signal"), drive signal transmitting wiring 304 (an example of "first drive signal transmitting wiring") that transmits the drive signal COM-A4 (an example of a "first drive signal"), drive signal transmitting wiring 314 (an example of "first drive signal transmitting wiring") that transmits the drive signal COM-B4 (an example of a "first drive signal") are provided on the second wiring layer LYR2. In addition, ground wiring 350 (an example of "wiring with a constant electric potential") is provided on the second wiring layer LYR2 in nearly all regions excluding a region where the drive signal transmitting wiring pieces 301, 304, 311, and 314 are disposed.

Figure 18:
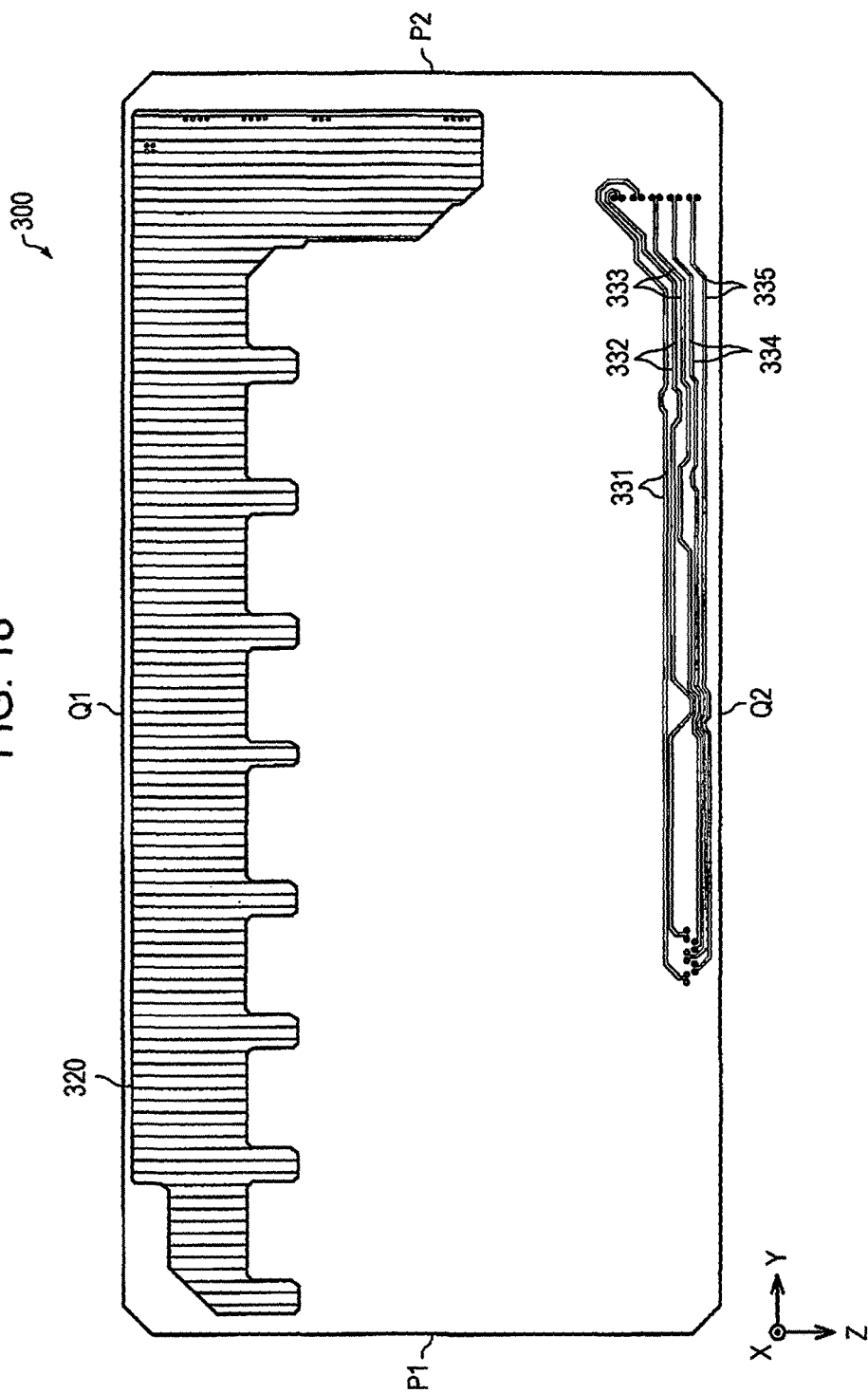
FIG. 18 is a view schematically illustrating an example of a configuration of a third wiring layer of the drive circuit substrate.

FIG. 18 is a view schematically illustrating an example of a configuration of the third wiring layer LYR3 of the drive circuit substrate 300 and is a view obtained by seeing through the third wiring layer LYR3 from the front surface side of the drive circuit substrate 300 (first wiring layer LYR1 side). As illustrated in FIG. 18, reference voltage signal transmitting wiring 320 that transmits the reference voltage signal VBS, control signal transmitting wiring 331 (an example of "first control signal transmitting wiring") that transmits the differential signal dS1 (an example of a "first control signal"), control signal transmitting wiring 332 (an example of "second control signal transmitting wiring") that transmits the differential signal dS2 (an example of a "second control signal"), control signal transmitting wiring 333 (an example of "second control signal transmitting wiring") that transmits the differential signal dS3 (an example of a "second control signal"), control signal transmitting wiring 334 (an example of "first control signal transmitting wiring") that transmits the differential signal dS4 (an example of a "first control signal"), and control signal transmitting wiring 335 that transmits the differential clock signal dClk are provided on the third wiring layer LYR3.

Figure 19:
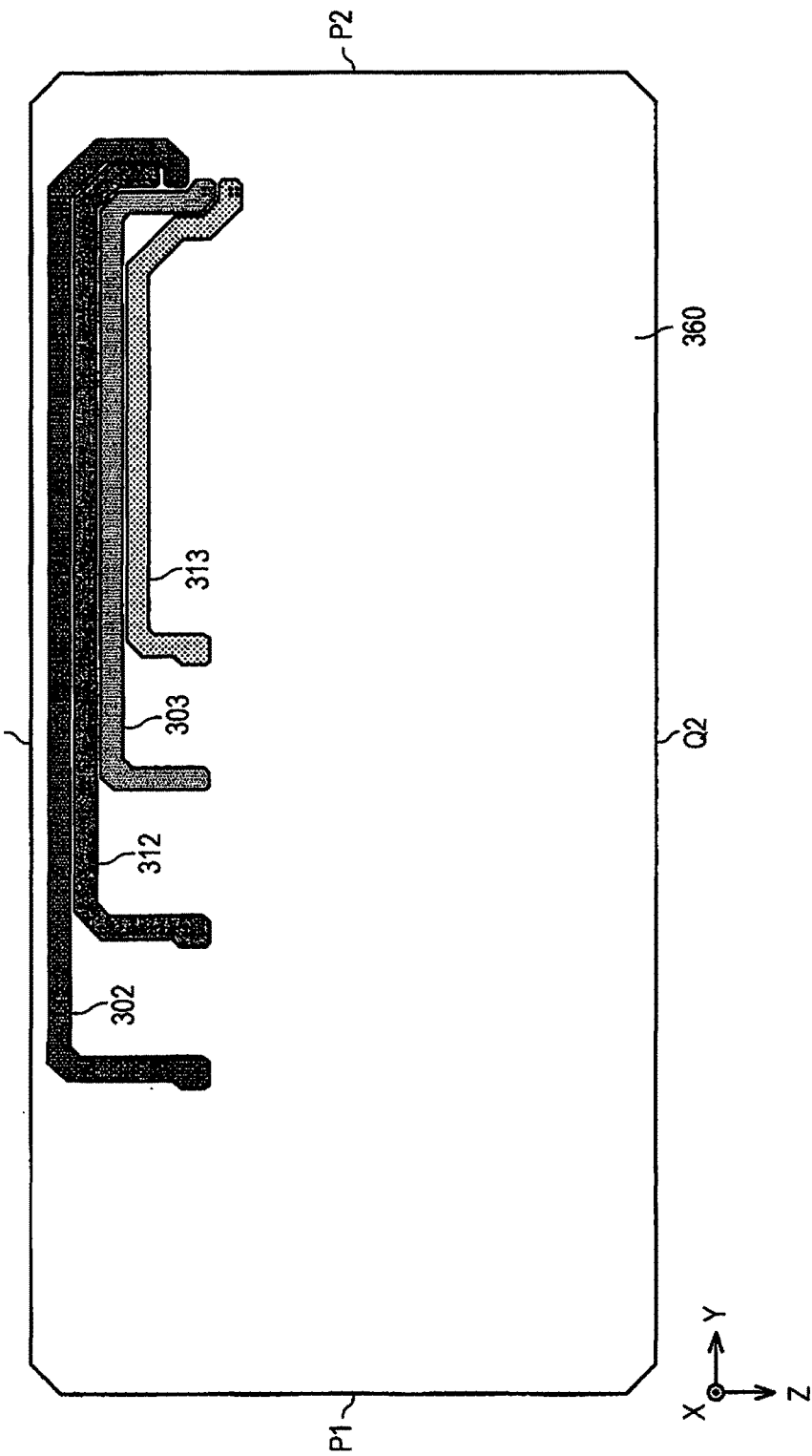
FIG. 19 is a view schematically illustrating an example of a configuration of a fourth wiring layer of the drive circuit substrate.

FIG. 19 is a view schematically illustrating an example of a configuration of the fourth wiring layer LYR4 of the drive circuit substrate 300 and is a view obtained by seeing through the fourth wiring layer LYR4 from the front surface side of the drive circuit substrate 300 (first wiring layer LYR1 side). As illustrated in FIG. 19, drive signal transmitting wiring 302 (an example of "second drive signal transmitting wiring") that transmits the drive signal COM-A2 (an example of a "second drive signal"), drive signal transmitting wiring 312 (an example of "second drive signal transmitting wiring") that transmits the drive signal COM-B2 (an example of a "second drive signal"), drive signal transmitting wiring 303 (an example of "second drive signal transmitting wiring") that transmits the drive signal COM-A3 (an example of a "second drive signal"), and drive signal transmitting wiring 313 (an example of "second drive signal transmitting wiring") that transmits the drive signal COM-B3 (an example of a "second drive signal") are provided on the fourth wiring layer LYR4. In addition, ground wiring 360 (an example of "wiring with a constant electric potential") is provided on the fourth wiring layer LYR4 in nearly all regions excluding a region where the drive signal transmitting wiring pieces 302, 303, 312, and 313 are disposed.

Figure 20:
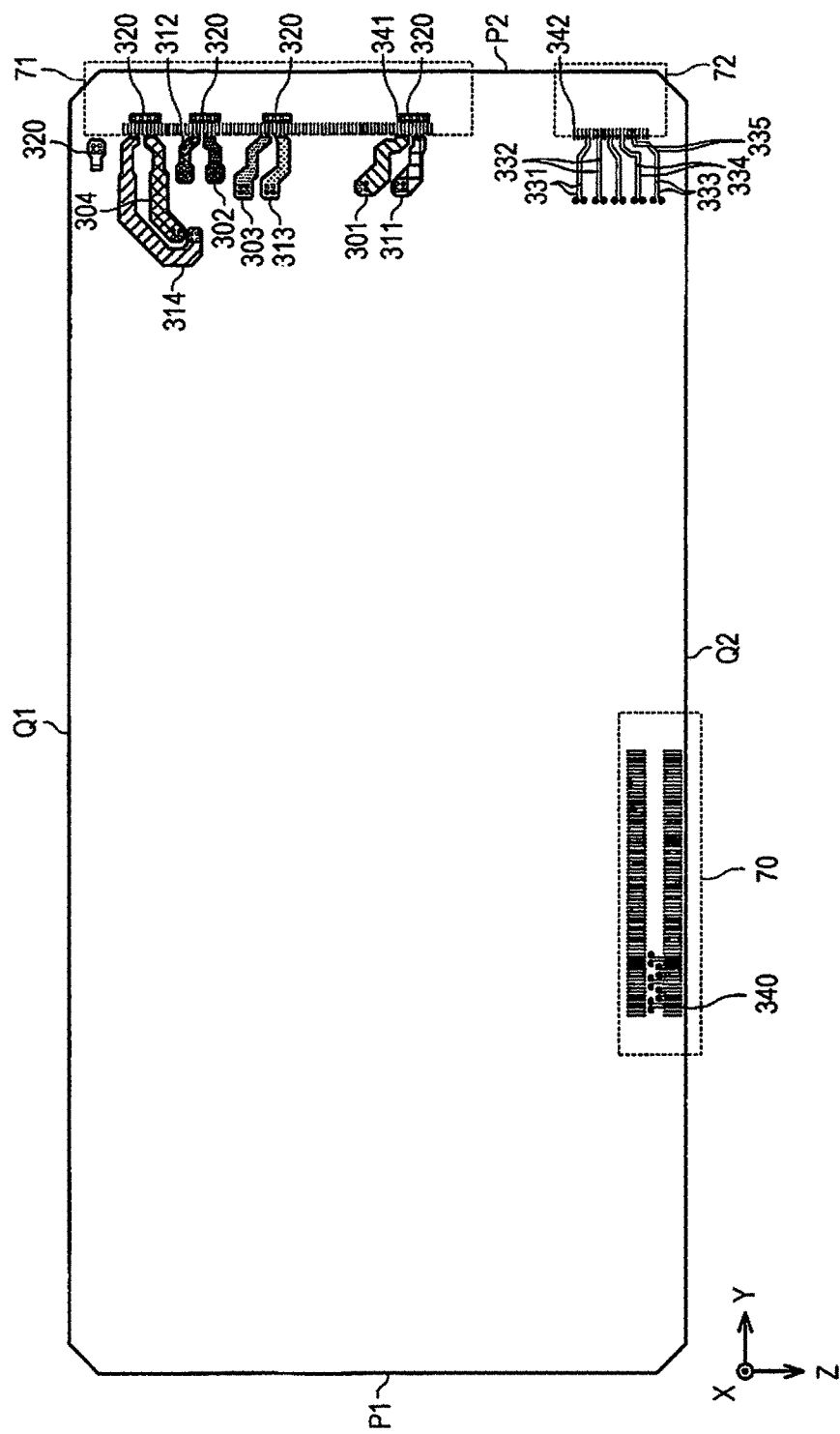
FIG. 20 is a view schematically illustrating an example of a configuration of an eighth wiring layer of the drive circuit substrate.

FIG. 20 is a view schematically illustrating an example of a configuration of the eighth wiring layer LYR8 of the drive circuit substrate 300 and is a view obtained by seeing through the eighth wiring layer LYR8 from the front surface side of the drive circuit substrate 300 (first wiring layer LYR1 side). As illustrated in FIG. 20, the drive signal transmitting wiring 301 that transmits the drive signal COM-A1, the drive signal transmitting wiring 311 that transmits the drive signal COM-B1, the drive signal transmitting wiring 302 that transmits the drive signal COM-A2, the drive signal transmitting wiring 312 that transmits the drive signal COM-B2, the drive signal transmitting wiring 303 that transmits the drive signal COM-A3, the drive signal transmitting wiring 313 that transmits the drive signal COM-B3, the drive signal transmitting wiring 304 that transmits the drive signal COM-A4, and the drive signal transmitting wiring 314 that transmits the drive signal COM-B4 are provided on the eighth wiring layer LYR8. The drive signal transmitting wiring pieces 301 to 304 and 311 to 314 provided on the eighth wiring layer LYR8 and the drive signal transmitting wiring pieces 301 to 304 and 311 to 314 provided on the first wiring layer LYR1 are connected to each other via through-holes and vias.

In addition, the control signal transmitting wiring 331 that transmits the differential signal dS1, the control signal transmitting wiring 332 that transmits the differential signal dS2, the control signal transmitting wiring 333 that transmits the differential signal dS3, the control signal transmitting wiring 334 that transmits the differential signal dS4, and the control signal transmitting wiring 335 that transmits the differential clock signal dClk are provided on the eighth wiring layer LYR8. The control signal transmitting wiring pieces 331 to 335 provided on the eighth wiring layer LYR8 and the control signal transmitting wiring pieces 331 to 335 provided on the third wiring layer LYR3 are connected to each other via through-holes and vias.

On the eighth wiring layer LYR8, the connector 70 including a plurality of terminals 340 is provided along a long side Q2 of the drive circuit substrate 300, and the connector 71 including a plurality of terminals 341 and the connector 72 including a plurality of terminals 342 are provided along the short side P2 of the drive circuit substrate 300.

A plurality of control signal input terminals, into which each of the differential signals dS1 to dS4 and the differential clock signal dClk is input, are included in the plurality of terminals 340 of the connector 70, and each of the control signal input terminals is connected to each of the control signal transmitting wiring pieces 331 to 335. In addition, a plurality of drive data input terminals, into which each of the drive data dA1 to dA4, dB1 to dB4 is input, are included in the plurality of terminals 340, and each of the plurality of drive data input terminals is connected to each of the plurality of drive data transmitting wiring pieces (not illustrated) provided on at least one of the first wiring layer LYR1 to eighth wiring layer LYR8. A plurality of terminals for communication are included in the plurality of terminals 340, and each of the plurality of terminals for communication is connected to each of the plurality of signal for communication transmitting wiring pieces (not illustrated) provided on at least one of the first wiring layer LYR1 to eighth wiring layer LYR8.

A plurality of drive signal output terminals, which output each of the drive signals COM-A1 to COM-A4, and COM-B1 to COM-B4, are included in the plurality of terminals 341 of the connector 71, and each of the plurality of drive signal output terminals is connected to each of the drive signal transmitting wiring pieces 301 to 304 and 311 to 314. In addition, at least one reference voltage signal output terminal, which outputs the reference voltage signal VBS, is included in the plurality of terminals 341, and the reference voltage signal output terminal is connected to the reference voltage signal transmitting wiring 320. A plurality of terminals for communication are included in the plurality of terminals 341, and each of the plurality of terminals for communication is connected to each of the plurality of signal for communication transmitting wiring pieces (not illustrated).

A plurality of control signal output terminals, which output each of the differential signals dS1 to dS4 and the differential clock signal dClk, are included in the plurality of terminals 342 of the connector 72, and each of the plurality of control signal output terminals is connected to each of the control signal transmitting wiring pieces 331 to 335.

The shortest distance between each control signal input terminal, which is included in the plurality of terminals 340 of the connector 70 and to which each of the differential signals dS1 to dS4 and the differential clock signal dClk is connected, and the long side Q2 of the drive circuit substrate 300 is shorter than the shortest distance between each of the control signal input terminals and the short side P2 intersecting the long side Q2 of the drive circuit substrate 300. In addition, the shortest distance between each control signal output terminal, which is included in the plurality of terminals 342 of the connector 72 and to which each of the differential signals dS1 to dS4 and the differential clock signal dClk is connected, and the short side P2 is shorter than the shortest distance between each of the control signal output terminals and the long side Q2. A distance between each control signal input terminal included in the plurality of terminals 340 and each control signal output terminal included in the plurality of terminals 342 is shorter than a distance between each of the control signal input terminals and each of the drive signal output terminals, which is included in the plurality of terminals 341 of the connector 71 and is connected to each of the drive signal transmitting wiring pieces 301 to 304 and 311 to 314. That is, in the embodiment, each of the control signal input terminals is provided along the long side Q2, and each of the control signal output terminals is provided at a position near to the long side Q2 along the short side P2 intersecting the long side Q2. Accordingly, the control signal transmitting wiring pieces 331 to 335 are shorter, and a possibility that the differential signals dS1 to dS4 and the differential clock signal dClk degrade is reduced.

Since each of the connectors 71 and 72 is provided along the short side P2 of the drive circuit substrate 300, which is near to the connectors 73 and 74 of each of the head units 32, the connection cables 75 and 76 are shorter, and a possibility that the drive signals COM-A1 to COM-A4, and COM-B1 to COM-B4, the differential signals dS1 to dS4, and the differential clock signal dClk degrade is reduced.

Figure 21:
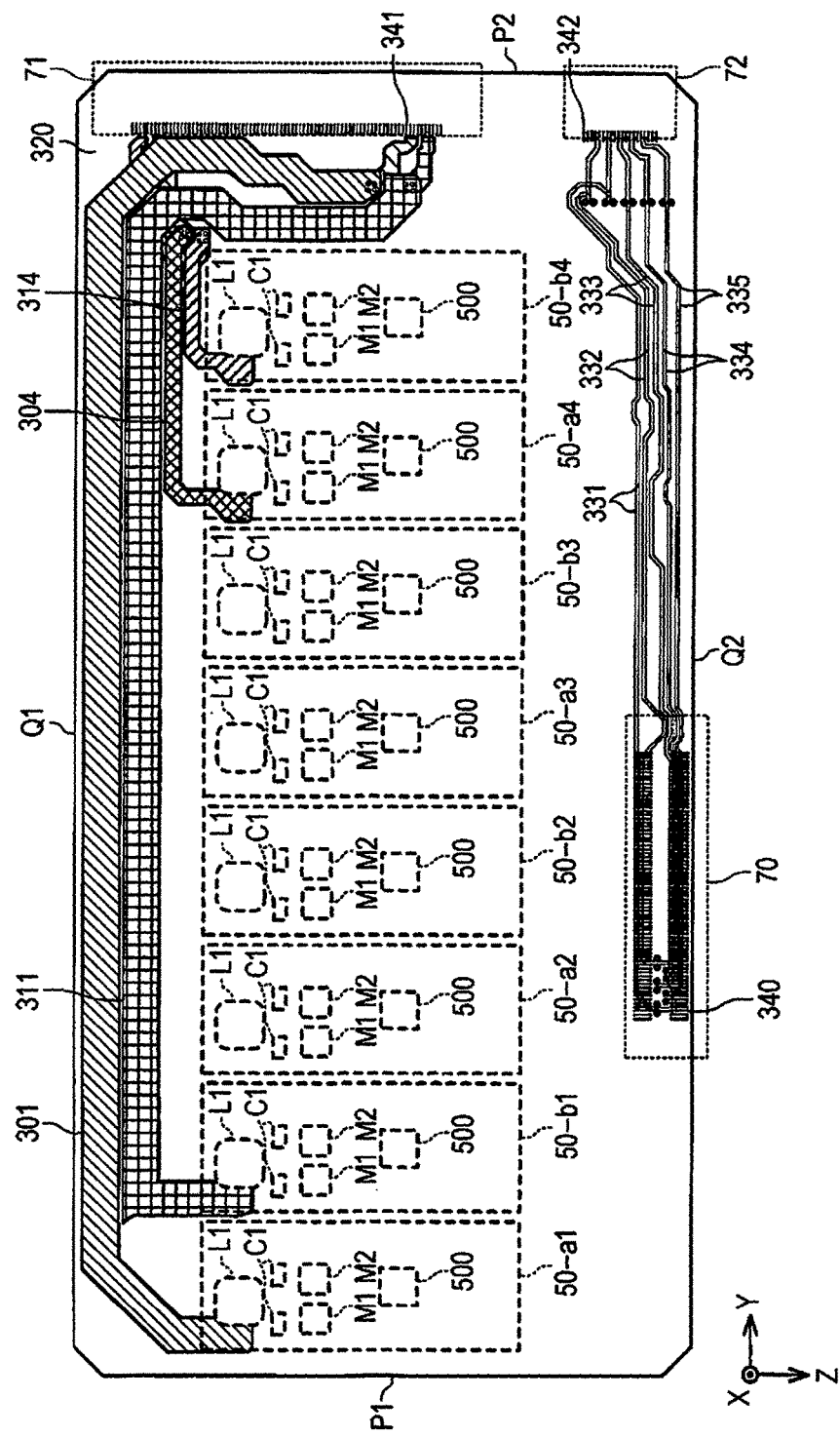
FIG. 21 is a view obtained by superimposing the first wiring layer, the second wiring layer, the third wiring layer, and the eighth wiring layer of the drive circuit substrate.
Figure 22:
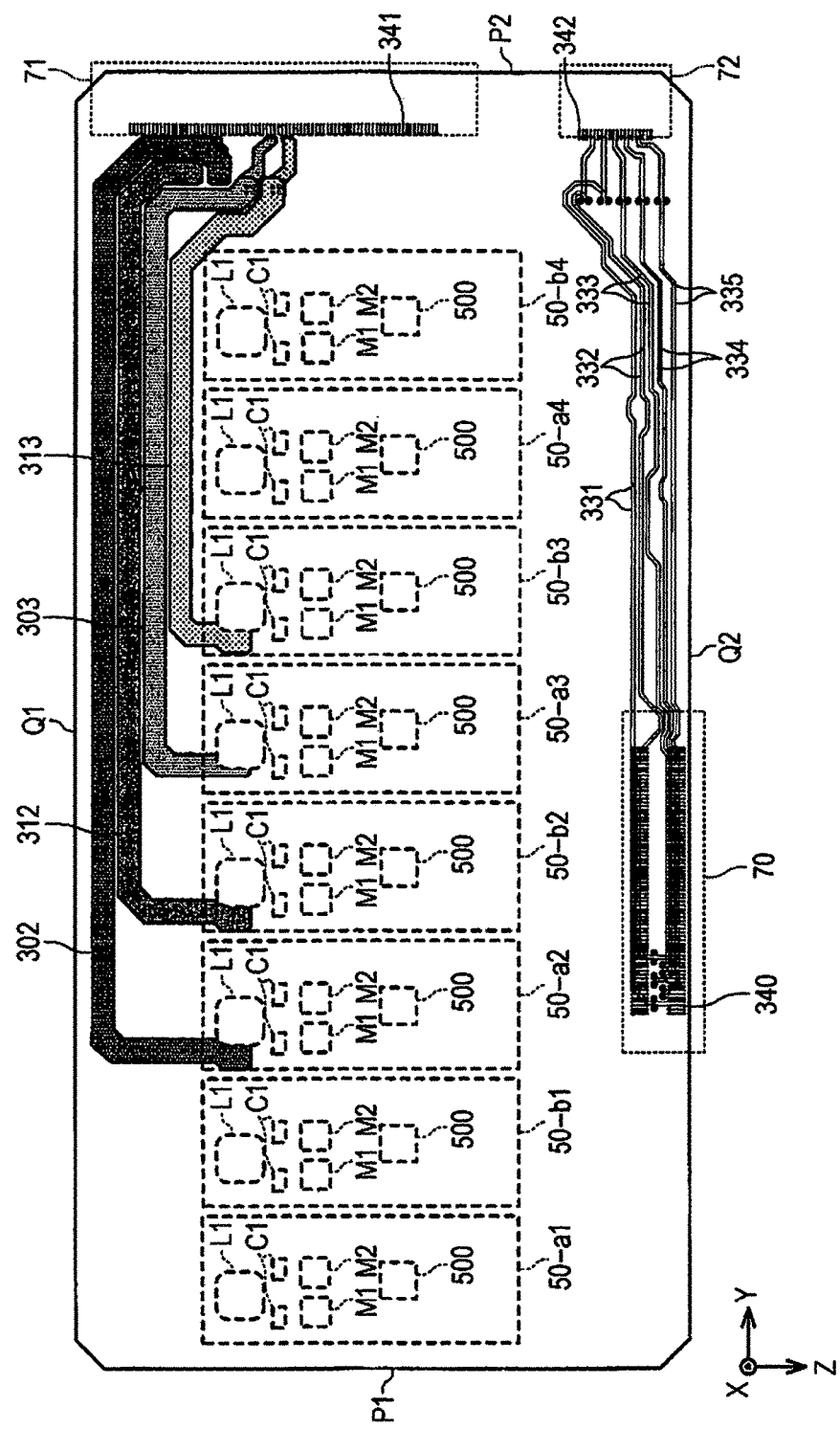
FIG. 22 is a view obtained by superimposing the first wiring layer, the third wiring layer, the fourth wiring layer, and the eighth wiring layer of the drive circuit substrate.

FIG. 21 is a view obtained by superimposing the first wiring layer LYR1 (FIG. 16), the second wiring layer LYR2 (FIG. 17), the third wiring layer LYR3 (FIG. 18), and the eighth wiring layer LYR8 (FIG. 20). FIG. 22 is a view obtained by superimposing the first wiring layer LYR1 (FIG. 16), the third wiring layer LYR3 (FIG. 18), the fourth wiring layer LYR4 (FIG. 19), and the eighth wiring layer LYR8 (FIG. 20). In FIGS. 21 and 22, the illustration of the reference voltage signal transmitting wiring 320 and the ground wiring pieces 350 and 360 is omitted.

In FIGS. 21 and 22, in the embodiment, the shortest distance between a long side Q1 (an example of a "first side") of the drive circuit substrate 300 and each of the drive signal transmitting wiring pieces 301 to 304 and 311 to 314 is shorter than the shortest distance between each of the drive signal transmitting wiring pieces 301 to 304 and 311 to 314 and each of the control signal transmitting wiring pieces 331 to 335. The shortest distance between the long side Q2 (an example of a "second side") opposing the long side Q1 of the drive circuit substrate 300 and each of the control signal transmitting wiring pieces 331 to 335 is shorter than the shortest distance between each of the drive signal transmitting wiring pieces 301 to 304 and 311 to 314 and each of the control signal transmitting wiring pieces 331 to 335. That is, since the drive signal transmitting wiring pieces 301 to 304 and 311 to 314 are provided along the long side Q1 and the control signal transmitting wiring pieces 331 to 335 are provided along the long side Q2, the drive signal transmitting wiring pieces 301 to 304 and 311 to 314 and the control signal transmitting wiring pieces 331 to 335 are sufficiently separated away from each other. Accordingly, a possibility that each signal degrades due to interference of the drive signals COM-A1 to COM-A4, and COM-B1 to COM-B4 with large amplitudes (for example, tens of V) propagated by each of the drive signal transmitting wiring pieces 301 to 304 and 311 to 314 and the differential signals dS1 to dS4 and the differential clock signal dClk with small amplitudes (for example, hundreds of mV) or high frequency, which are propagated by each of the control signal transmitting wiring pieces 331 to 335, with each other, is reduced.

In FIGS. 21 and 22 in the embodiment, in planar view of the drive circuit substrate 300, the drive circuits 50-a1 to 50-a4 and 50-b1 to 50-b4 are provided between the drive signal transmitting wiring pieces 301 to 304 and 311 to 314 and the control signal transmitting wiring pieces 331 to 335. As described above, since the drive signal transmitting wiring pieces 301 to 304 and 311 to 314 and the control signal transmitting wiring pieces 331 to 335 are disposed so as to be sufficiently separated away from each other), a large free region is generated between the wiring pieces. The miniaturization of the drive circuit substrate 300 is realized in the embodiment since the short sides P1 and P2 of the drive circuit substrate 300 are shorter by disposing the drive circuits 50-a1 to 50-a4 and 50-b1 to 50-b4 in the free region.

In FIGS. 21 and 22, in the embodiment, the shortest distance between the control signal transmitting wiring pieces 331 to 335 and the integrated circuit devices 500 (modulating unit 510) included in the drive circuits 50-a1 to 50-a4 and 50-b1 to 50-b4 is shorter than the shortest distance between the control signal transmitting wiring pieces 331 to 335 and the first transistors M1 and the second transistors M2 (amplification circuit). That is, the drive circuits 50-a1 to 50-a4 and 50-b1 to 50-b4 are disposed such that the first transistors M1 and the second transistors M2, in which large currents flow, are disposed so as to be sufficiently separated away from the control signal transmitting wiring pieces 331 to 335, which respectively transmit the differential signals dS1 to dS4 and the differential clock signal dClk with small amplitudes. Accordingly, a possibility that the differential signals dS1 to dS4 and the differential clock signal dClk degrade is further reduced.

In FIGS. 17, 18, and 19 in the embodiment, the ground wiring pieces 350 and 360 are respectively provided on the second wiring layer LYR2 and the fourth wiring layer LYR4, which are two layers sandwiching the third wiring layer LYR3 (an example of a "first layer") of the drive circuit substrate 300, in regions opposing a region, in which the differential signals dS1 to dS4 and the differential clock signal dClk are provided. That is, the control signal transmitting wiring pieces 331 to 335 are guarded by being sandwiched between the ground wiring pieces 350 and 360, and a possibility that the differential signals dS1 to dS4 and the differential clock signal dClk degrade is further reduced.

In FIGS. 17 and 18, in the embodiment, the drive signal transmitting wiring pieces 301, 304, 311, and 314 are provided on the second wiring layer LYR2 (an example of a "second layer") of the drive circuit substrate 300, and the reference voltage signal transmitting wiring 320 is provided on the third wiring layer LYR3 (an example of a "third layer") of the drive circuit substrate 300, in a region opposing a region where the drive signal transmitting wiring pieces 301, 304, 311, and 314 are provided. Similarly, in FIGS. 18 and 19 in the embodiment, the drive signal transmitting wiring pieces 302, 303, 312, and 313 are provided on the fourth wiring layer LYR4 (an example of a "fourth layer") of the drive circuit substrate 300. The reference voltage signal transmitting wiring 320 is provided on the third wiring layer LYR3 of the drive circuit substrate 300, in a region opposing a region where the drive signal transmitting wiring pieces 302, 303, 312, and 313 are provided. That is, the reference voltage signal transmitting wiring 320 is provided on the third wiring layer LYR3 positioned between the second wiring layer LYR2 and the fourth wiring layer LYR4 so as to oppose the drive signal transmitting wiring pieces 301, 304, 311, and 314 provided on the second wiring layer LYR2 and the drive signal transmitting wiring pieces 302, 303, 312, and 313 provided on the fourth wiring layer LYR4. Since the voltages of the drive signals COM-A1 and COM-B1 are higher than the voltage of the reference voltage signal VBS although, for example, the drive signal COM-A1 or the drive signal COM-B1 is applied to one end of each of the piezoelectric elements 60 included in the drive module 20-1 and the reference voltage signal VBS is applied to the other end, there is a current path through which a large current flows in the drive signal transmitting wiring 301 or the drive signal transmitting wiring 311, each of the piezoelectric elements 60, and the reference voltage signal transmitting wiring 320, in this order. In the embodiment, the drive signal transmitting wiring pieces 301 to 304 and 311 to 314 and the reference voltage signal transmitting wiring 320 are provided so as to oppose each other on different wiring layers. Accordingly, each current path is shorter and the wiring impedance of each current path is reduced.

In addition, a current flows in the reference voltage signal transmitting wiring 320 in a direction from the short side P2 to the short side P1 of the drive circuit substrate 300 while a current flows in the drive signal transmitting wiring pieces 301 to 304 and 311 to 314 in a direction from the short side P1 to the short side P2 of the drive circuit substrate 300. That is, a current that flows in the drive signal transmitting wiring pieces 301 to 304 and 311 to 314 and a current that flows in the reference voltage signal transmitting wiring 320 have directions opposite to each other and have almost the same total amount, and a magnetic field generated by the current that flows in the drive signal transmitting wiring pieces 301 to 304 and 311 to 314 and a magnetic field generated by the current that flows in the reference voltage signal transmitting wiring 320 cancel each other out. Accordingly, the wiring impedance of each current path is further reduced. Since relative positional and distance relationships between each of the drive signal transmitting wiring pieces 301 to 304 and 311 to 314 and the reference voltage signal transmitting wiring 320 are the same, variations in the accuracy of transmitting the drive signals COM-A1 to COM-A4, and COM-B1 to COM-B4 are reduced.

In FIGS. 21 and 22 in the embodiment, in planar view of the drive circuit substrate 300, the shortest distance between the drive circuit 50-a1 and each drive signal output terminal (an example of a "first drive signal output terminal"), which is included in the plurality of terminals 341 of the connector 71 and to which each of the drive signal transmitting wiring pieces 301 and 311 is connected, is longer than the shortest distance between the drive circuit 50-a2 and each drive signal output terminal (an example of a "second drive signal output terminal"), which is included in the plurality of terminals 341 of the connector 71 and to which each of the drive signal transmitting wiring pieces 302 and 312 is connected, and the maximum widths of the drive signal transmitting wiring pieces 301 and 311 are larger than the maximum widths of the drive signal transmitting wiring pieces 302 and 312. In planar view of the drive circuit substrate 300, the shortest distance between the drive circuit 50-a3 and each drive signal output terminal, which is included in the plurality of terminals 341 of the connector 71 and to which each of the drive signal transmitting wiring pieces 303 and 313 is connected, is longer than the shortest distance between the drive circuit 50-a4 and each drive signal output terminal, which is included in the plurality of terminals 341 of the connector 71 and to which each of the drive signal transmitting wiring pieces 304 and 314 is connected, and the maximum widths of the drive signal transmitting wiring pieces 303 and 313 are larger than the maximum widths of the drive signal transmitting wiring pieces 304 and 314. The maximum widths of the drive signal transmitting wiring pieces 303 and 313 and the maximum widths of the drive signal transmitting wiring pieces 303 and 313 are almost the same. That is, in the embodiment, in general, drive signal transmitting wiring having a larger length has a larger thickness. Accordingly, the wiring impedance of each of the drive signal transmitting wiring pieces 301 to 304 and 311 to 314 is the same, and variations in the accuracy of transmitting the drive signals COM-A1 to COM-A4, and COM-B1 to COM-B4 are further reduced. In FIGS. 17 and 19 in the embodiment, a sum of the maximum widths of the drive signal transmitting wiring pieces 301, 311, 304, and 314 provided on the second wiring layer LYR2 and a sum of the maximum widths of the drive signal transmitting wiring pieces 302, 312, 303, and 314 provided on the fourth wiring layer LYR4 are almost the same. Accordingly, free regions on the second wiring layer LYR2 and the fourth wiring layer LYR4 reduce. Since the short sides P1 and P2 of the drive circuit substrate 300 are shorter, the miniaturization of the drive circuit substrate 300 is realized.

9. Operation and Advantages

As described above, in the liquid discharging apparatus 1 according to the embodiment, since drive signal transmitting wiring and control signal transmitting wiring are sufficiently separated away from each other on each drive circuit substrate 300, a possibility that each signal degrades due to interference of the drive signals COM-A1 to COM-An and COM-B1 to COM-Bn with large amplitudes and the differential signals dS1 to dSn and the differential clock signal dClk with small amplitudes and high frequency with each other is reduced. On each drive circuit substrate 300, the first transistor M1 and the second transistor M2, in which a large current flows, are sufficiently separated away from control signal transmitting wiring, control signal transmitting wiring is guarded by being sandwiched between ground wiring pieces on upper and lower wiring layers, and a possibility that the differential signals dS1 to dSn and the differential clock signal dClk degrade is reduced. Each current path is shorter since each drive signal transmitting wiring and reference voltage signal transmitting wiring are provided so as to oppose each other, and a magnetic field generated by a current that flows in each drive signal transmitting wiring and a magnetic field generated by a current that flows in the reference voltage signal transmitting wiring cancel each other out. Accordingly, the wiring impedance of each current path is reduced. Since relative positional and distance relationships between each drive signal transmitting wiring and the reference voltage signal transmitting wiring are the same, drive signal transmitting wiring having a larger length has a larger thickness, and the wiring impedance of each drive signal transmitting wiring is the same, variations in the accuracy of transmitting the drive signals COM-A1 to COM-An and COM-B1 to COM-Bn are reduced. Therefore, in the liquid discharging apparatus 1 according to the embodiment, the accuracy of each drive circuit substrate 300 transmitting the drive signals COM-A1 to COM-An and COM-B1 to COM-Bn, the differential signals dS1 to dSn, and the differential clock signal dClk improves, and a liquid can be accurately discharged from each of the head units 32.

In the liquid discharging apparatus 1 according to the embodiment, the drive circuits 50-a1 to 50-a4 and 50-b1 to 50-b4 are disposed in a free region between a plurality of drive signal transmitting wiring pieces and a plurality of control signal transmitting wiring pieces on each drive circuit substrate 300. In addition, on each drive circuit substrate 300, the plurality of drive signal transmitting wiring pieces having different widths are separately provided on a plurality of wiring layers, and the area of a wiring region of drive signal transmitting wiring on each wiring layer is the same. Therefore, in the liquid discharging apparatus 1 according to the embodiment, each drive circuit substrate 300 can be miniaturized since a free region of each drive circuit substrate 300 can be reduced.

In addition, in each drive circuit substrate 300 of the liquid discharging apparatus 1 according to the embodiment, the control signal transmitting wiring pieces 331 to 335 are shorter since each control signal input terminal connected to each of the control signal transmitting wiring pieces 331 to 335 is provided along the long side Q2 and each control signal output terminal connected to each of the control signal transmitting wiring pieces 331 to 335 is provided along the short side P2 intersecting the long side Q2 at a position near to the long side Q2. In each drive circuit substrate 300, the differential signals dS1 to dSn and the differential clock signal dClk are transmitted to the head unit 32 by the connection cable 76 connected to the connector 72, in addition to the connection cable 75 that is connected to the connector 71 and transmits the drive signals COM-A1 to COM-An and COM-B1 to COM-Bn and various types of signals for communication to the head unit 32. Therefore, in the liquid discharging apparatus 1 according to the embodiment, a liquid can be accurately discharged from each of the head units 32 since a possibility that the differential signals dS1 to dS4 and the differential clock signal dClk degrade is reduced. In the drive circuit substrate 300 in the liquid discharging apparatus 1 according to the embodiment, the connection cables 75 and 76 are shorter since each of the connectors 71 and 72 is provided along the short side P2, which is near to the connectors 73 and 74 of each of the head units 32, and a liquid can be accurately discharged from each of the head units 32 since a possibility that the drive signals COM-A1 to COM-A4, COM-B1 to COM-B4, the differential signals dS1 to dS4, and the differential clock signal dClk degrade is reduced.

In the liquid discharging apparatus 1 according to the embodiment, the drive circuits 50-a1 to 50-an and 50-b1 to 50-bn can be stably operated without stress from the heat dissipating plate 42 being applied since each heat dissipating plate 42 is mounted on the surface on a side opposite to the drive circuit mounted surface of each drive circuit substrate 300. The heat of each drive circuit substrate 300 is efficiently transmitted to the heat dissipating case 34 via each heat dissipating plate 42 since each heat dissipating plate is in contact with the heat dissipating case 34. Therefore, in the liquid discharging apparatus 1 according to the embodiment, a liquid can be accurately discharged from each of the head units 32 since a possibility that a failure in operation of the drive circuits 50-a1 to 50-an and 50-b1 to 50-bn occurs and the drive signals COM-A1 to COM-An and COM-B1 to COM-Bn degrade can be reduced.

In the liquid discharging apparatus 1 according to the embodiment, the length of wiring that propagates the drive signals COM-A1 to COM-An and COM-B1 to COM-Bn to the piezoelectric elements 60 is shorter since the control substrate 36, the plurality of drive circuit substrates 300, and the plurality of head units 32 are mounted on the movable carriage 29. Therefore, in the liquid discharging apparatus 1 according to the embodiment, a liquid can be accurately discharged from each of the head units 32 since the occurrence of overshoot and ringing in drive waveforms of the piezoelectric elements 60 can be decreased.

In the liquid discharging apparatus 1 according to the embodiment, it is possible to mount the plurality of drive circuit units 37 at high density on the carriage 29 since each drive circuit substrate 300 is connected to the control substrate 36 in a direction where the drive circuit mounted surface intersects a surface of the control substrate 36. Therefore, in the liquid discharging apparatus 1 according to the embodiment, the liquid discharging unit 2 can be miniaturized.

In the liquid discharging apparatus 1 according to the embodiment, the drive circuit substrate 300, which is a replacement target, can be easily replaced in a case where the replacement of each drive circuit substrate 300 is necessary since each drive circuit substrate 300 is attachably/detachably connected to the control substrate 36 via the connector 70.

10. Modification Example

Although the control unit 10 and the liquid discharging unit 2 are connected to each other by at least one flexible flat cable 190 in the embodiment described above, the control unit and the liquid discharging unit may be connected to each other by a plurality of flexible flat cables. For example, each of the N flexible flat cables may transmit the drive data pieces dA1 to dAn and dB1 to dBn, the differential signals dS1 to dSn, and the differential clock signal dClk to each of the discharge modules 200. Although various types of signals are transmitted from the control unit 10 to the liquid discharging unit 2 by the (wired) flexible flat cable 190 in embodiment described above, the signals may be wirelessly transmitted.

Although a piezoelectric liquid discharging apparatus, in which a drive circuit drives a piezoelectric element (capacitive load) as a driving element, is given as an example in the embodiment described above, the invention is also applicable to a liquid discharging apparatus in which a drive circuit drives a driving element other than a capacitive load. As an example of such a liquid discharging apparatus, a thermal (bubble type) liquid discharging apparatus, in which a drive circuit drives a heating element (for example, resistance) as a driving element and a liquid is discharged using bubbles generated by heating of the heating element, is given.

Although the printing apparatus such as a printer is given as an example of the liquid discharging apparatus, the invention is also applicable to liquid discharging apparatuses including a color material discharging apparatus used in manufacturing color filters, such as a liquid crystal display, an electrode material discharging apparatus used in forming electrodes, such as an organic EL display and a field emission display (FED), a bioorganic material discharging apparatus used in manufacturing biochips, a three-dimensional modelling apparatus (so-called 3D printer), and a textile printing apparatus.

Although the embodiment or a modification example has been described, the invention is not limited to the embodiment or the modification example, and can be carried out in various forms without departing from the spirit of the invention. For example, the embodiment and each modification example described above can be combined as appropriate.

The invention includes practically the same configuration (for example, a configuration where functions, methods, and results are the same or a configuration where an object and advantages are the same) as the configuration described in the embodiment. The invention includes a configuration where an inessential portion of a configuration described in the embodiment is substituted. The invention includes a configuration with which the same operational advantages described in the embodiment are achieved or a configuration with which the same object can be accomplished. In addition, the invention includes a configuration where a known technique is added to a configuration described in the embodiment.

The entire disclosure of Japanese Patent Application No. 2016-248692, filed Dec. 22, 2016 is expressly incorporated by reference herein.

What is claimed is:

1. A liquid discharging apparatus comprising:
    a head unit that has a first driving element and discharges a first liquid based on a first drive signal for driving the first driving element and a first control signal for controlling application of the first drive signal to the first driving element; and
    a circuit substrate,
    wherein first drive signal transmitting wiring through which the first drive signal is transmitted and first control signal transmitting wiring through which the first control signal is transmitted are provided on the circuit substrate,
    the shortest distance between a first side of the circuit substrate and the first drive signal transmitting wiring is shorter than the shortest distance between the first drive signal transmitting wiring and the first control signal transmitting wiring, and
    the shortest distance between a second side opposing the first side of the circuit substrate and the first control signal transmitting wiring is shorter than the shortest distance between the first drive signal transmitting wiring and the first control signal transmitting wiring.

2. The liquid discharging apparatus according to claim 1, wherein a first drive circuit that outputs the first drive signal is provided on the circuit substrate.

3. The liquid discharging apparatus according to claim 2, wherein the first drive circuit is provided between the first drive signal transmitting wiring and the first control signal transmitting wiring in planar view of the circuit substrate.

4. The liquid discharging apparatus according to claim 2, wherein the first drive circuit includes
    a modulation circuit that modulates an original drive signal, which is an underlying signal of the first drive signal, to generate a modulation signal,
    an amplification circuit that generates an amplified modulation signal obtained by amplifying the modulation signal, and
    a demodulation circuit that demodulates the amplified modulation signal to generate the first drive signal, and
    the shortest distance between the first control signal transmitting wiring and the modulation circuit is shorter than the shortest distance between the first control signal transmitting wiring and the amplification circuit.

5. The liquid discharging apparatus according to claim 2, wherein the head unit has a second driving element and discharges a second liquid based on a second drive signal for driving the second driving element and a second control signal for controlling application of the second drive signal to the second driving element, second drive signal transmitting wiring through which the second drive signal is transmitted, a second drive circuit that outputs the second drive signal, a first drive signal output terminal that is connected to the first drive signal transmitting wiring and outputs the first drive signal to the head unit, and a second drive signal output terminal that is connected to the second drive signal transmitting wiring and outputs the second drive signal to the head unit are further provided on the circuit substrate, the shortest distance between the first drive circuit and the first drive signal output terminal is longer than the shortest distance between the second drive circuit and the second drive signal output terminal in planar view of the circuit substrate, and a maximum width of the first drive signal transmitting wiring is larger than a maximum width of the second drive signal transmitting wiring in planar view of the circuit substrate.

6. The liquid discharging apparatus according to claim 1, wherein the first control signal transmitting wiring is provided on a first layer of the circuit substrate, and wiring with a constant electric potential is provided on each of two layers sandwiching the first layer of the circuit substrate, in regions opposing a region where the first control signal transmitting wiring is provided.

7. The liquid discharging apparatus according to claim 1, wherein the head unit discharges the first liquid by the first driving element being driven by the first drive signal applied to one end of the first driving element and a reference voltage signal applied to the other end of the first driving element, reference voltage signal transmitting wiring through which the reference voltage signal is transmitted is further provided on the circuit substrate, the first drive signal transmitting wiring is provided on a second layer of the circuit substrate, and the reference voltage signal transmitting wiring is provided on a third layer of the circuit substrate, in a region opposing a region where the first drive signal transmitting wiring is provided.

8. The liquid discharging apparatus according to claim 7, wherein the head unit has a second driving element and discharges a second liquid based on a second drive signal for driving the second driving element and a second control signal for controlling application of the second drive signal to the second driving element, second drive signal transmitting wiring through which the second drive signal is transmitted is further provided on the circuit substrate, the second drive signal transmitting wiring is provided on a fourth layer of the circuit substrate, in a region opposing a region where the reference voltage signal transmitting wiring is provided, and the third layer is a layer positioned between the second layer and the fourth layer.

9. A circuit substrate that is connected to a head unit having a first driving element and discharging a first liquid based on a first drive signal for driving the first driving element and a first control signal for controlling application of the first drive signal to the first driving element, the substrate comprising:

first drive signal transmitting wiring through which the first drive signal is transmitted; and first control signal transmitting wiring through which the first control signal is transmitted, wherein the shortest distance between a first side of the circuit substrate and the first drive signal transmitting wiring is shorter than the shortest distance between the first drive signal transmitting wiring and the first control signal transmitting wiring, and the shortest distance between a second side opposing the first side of the circuit substrate and the first control signal transmitting wiring is shorter than the shortest distance between the first drive signal transmitting wiring and the first control signal transmitting wiring.

* * * * *